(12) United States Patent
Park

(10) Patent No.: US 10,388,387 B2
(45) Date of Patent: Aug. 20, 2019

(54) MEMORY SYSTEM AND OPERATING METHOD OF MEMORY SYSTEM

(71) Applicant: SK hynix Inc., Gyeonggi-do (KR)

(72) Inventor: Byeong-Gyu Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/927,127

(22) Filed: Mar. 21, 2018

(65) Prior Publication Data

US 2019/0051361 A1   Feb. 14, 2019

(30) Foreign Application Priority Data

Aug. 11, 2017   (KR) ........................ 10-2017-0102554

(51) Int. Cl.
| | | |
|---|---|---|
| *G11C 16/34* | (2006.01) | |
| *G06F 12/02* | (2006.01) | |
| *G11C 16/30* | (2006.01) | |
| *G11C 5/14* | (2006.01) | |
| *G06F 1/3225* | (2019.01) | |
| *G11C 11/4074* | (2006.01) | |
| *G11C 7/04* | (2006.01) | |
| *G11C 16/26* | (2006.01) | |

(52) U.S. Cl.
CPC ........ *G11C 16/3404* (2013.01); *G06F 1/3225* (2013.01); *G06F 12/0246* (2013.01); *G11C 5/147* (2013.01); *G11C 7/04* (2013.01); *G11C 11/4074* (2013.01); *G11C 16/26* (2013.01); *G11C 16/30* (2013.01); *G11C 16/349* (2013.01); *G11C 16/3418* (2013.01); *G11C 16/3495* (2013.01); *G06F 2212/7211* (2013.01)

(58) Field of Classification Search
CPC .............. G11C 16/349; G11C 11/4074; G11C 16/0483; G11C 16/26; G11C 16/30; G11C 16/3404; G11C 16/3418; G11C 16/3495; G11C 5/147; G11C 7/04; G06F 12/0246; G06F 1/3225; G06F 2212/7211
USPC ..... 365/189.09, 226, 230.03, 189.11, 189.12
See application file for complete search history.

(56) References Cited

U.S. PATENT DOCUMENTS

| | | | | |
|---|---|---|---|---|
| 10,042,568 B2* | 8/2018 | de Silva | ............... | G06F 3/0619 |
| 10,042,569 B2* | 8/2018 | Lee | ................. | G06F 3/0619 |
| 2017/0337001 A1* | 11/2017 | Lee | ................. | G06F 3/0626 |
| 2018/0012666 A1* | 1/2018 | Kim | ................. | G06F 3/0604 |
| 2018/0357157 A1* | 12/2018 | Byun | ................. | G06F 12/0246 |

FOREIGN PATENT DOCUMENTS

| KR | 1020090014036 | 2/2009 |
|---|---|---|
| KR | 100974954 | 8/2010 |

* cited by examiner

*Primary Examiner* — Gene N Auduong
(74) *Attorney, Agent, or Firm* — IP & T Group LLP

(57) ABSTRACT

A memory system includes: a memory device including a plurality of memory blocks each including a plurality of pages suitable for storing data; and a controller suitable for receiving a plurality of commands from a host, performing a plurality of command executions on the plurality of memory blocks in response to the plurality of commands, checking parameters of the plurality of memory blocks according to the plurality of command executions performed on the plurality of memory blocks, selecting first memory blocks among the plurality of memory blocks according to the parameters, and copying data stored in the first memory blocks to second memory blocks among the plurality of memory blocks.

20 Claims, 13 Drawing Sheets

MEMORY SYSTEM AND OPERATING METHOD OF MEMORY SYSTEM

CROSS-REFERENCE TO RELATED APPLICATION

This application claims priority under 35 U.S.C. § 119 to Korean Patent Application No. 10-2017-0102554, filed on Aug. 11, 2017, the disclosure of which is incorporated herein by reference in its entirety.

TECHNICAL FIELD

Various exemplary embodiments relate to a memory system. Particularly, the exemplary embodiments relate to a memory system for processing data with respect to a memory device, and an operating method thereof.

DISCUSSION OF THE RELATED ART

The computer environment paradigm has changed to ubiquitous computing systems that can be used anytime and anywhere. Due to this change, use of portable electronic devices such as mobile phones, digital cameras, and notebook computers are soaring. These portable electronic devices generally use a memory system having one or more memory devices for storing data. A memory system may be used as a main or an auxiliary storage device of a portable electronic device.

Memory systems provide excellent stability, durability, high information access speed, and low power consumption because they have no moving parts. Examples of memory systems having such advantages include universal serial bus (USB) memory devices, memory cards having various interfaces, and solid state drives (SSD).

SUMMARY

Various embodiments are directed to a memory system and an operating method thereof, capable of minimizing a complexity and a performance deterioration of a memory system and maximizing a use efficiency of a memory device, thereby quickly and stably processing data with respect to the memory device.

In an embodiment, a memory system may include: a memory device including a plurality of memory blocks each including a plurality of pages suitable for storing data; and a controller suitable for receiving a plurality of commands from a host, performing a plurality of command executions to the plurality of memory blocks in response to the plurality of commands, checking parameters of the plurality of memory blocks according to the plurality of command executions performed on the plurality of memory blocks, selecting first memory blocks among the plurality of memory blocks according to the parameters, and copying data stored in the first memory blocks to second memory blocks among the plurality of memory blocks.

The controller may check parameters of the plurality of memory blocks by checking a first parameter and a second parameter of each of the plurality of memory blocks. The controller may select the first memory blocks by calculating a weighted first parameter of each of the plurality of memory blocks by giving to the first parameter a weight corresponding to the second parameter, and selecting the first memory blocks according to the weighted first parameter of each of the plurality of memory blocks.

The controller may check parameters of the plurality of memory blocks by checking a temperature of each of the plurality of memory blocks. The controller may select the first memory blocks by calculating a compensated first parameter of each of the plurality of memory blocks by compensating for the weighted first parameter by a temperature offset to the temperature, and selecting the first memory blocks according to the compensated first parameter of each of the plurality of memory blocks.

The controller may further calculate a voltage offset of each of the plurality of memory blocks corresponding to the compensated first parameter, may compensate for a read voltage for each of a plurality of read operations to be performed on the plurality of memory blocks by the voltage offset, and may perform the plurality of read operations on the plurality of memory blocks through the read voltage compensated by, the voltage offset.

The controller may further calculate a voltage offset of each of the plurality of memory blocks corresponding to the weighted first parameter, may compensates for a read voltage for each of a plurality of read operations to be performed to the plurality of memory blocks by the voltage offset, and may perform the plurality of read operations on the plurality of memory blocks through the read voltage compensated by, the voltage offset.

The controller may check parameters of the plurality of memory blocks by checking a first parameter and a second parameter of each of the plurality of memory blocks. The controller may select the first memory blocks by calculating a normalized first parameter of each of the plurality of memory blocks through the second parameter, and selecting the first memory blocks according to the normalized first parameter of each of the plurality of memory blocks.

The controller may check parameters of the plurality of memory blocks by checking a temperature of each of the plurality of memory blocks. The controller may select the first memory blocks by calculating a compensated first parameter of each of the plurality of memory blocks by compensating for the normalized first parameter by a temperature offset to the temperature, and selecting the first memory blocks according to the compensated first parameter of each of the plurality of memory blocks.

The controller may further calculate a voltage offset of each of the plurality of memory blocks corresponding to the compensated first parameter, may compensate for a read voltage for each of a plurality of read operations to be performed on the plurality of memory blocks by the voltage offset, and may perform the plurality of read operations on the plurality of memory blocks through the read voltage compensated by the voltage offset.

The controller may further calculate a voltage offset of each of the plurality of memory blocks corresponding to the normalized first parameter, may compensate for a read voltage for each of a plurality of read operations to be performed on the plurality of memory blocks by the voltage offset, and may perform the plurality of read operations on the plurality of memory blocks through the read voltage compensated by the voltage offset.

The controller may check parameters of the plurality of memory blocks by checking a minimum parameter, a maximum parameter and an average parameter of each of the plurality of pages included in each of the plurality of memory blocks, and selecting one of the minimum parameter, the maximum parameter and the average parameter as a representative parameter of each of the plurality of memory blocks. The controller may select the first memory blocks according to the representative parameter of each of the plurality of memory blocks.

In an embodiment, an operating method of a memory system, may include: receiving a plurality of commands from a host for a memory device including a plurality of memory blocks each including a plurality of pages suitable for storing data; performing a plurality of command executions to the plurality of memory blocks in response to the plurality of commands; checking parameters of the plurality of memory blocks according to the plurality of command executions performed to the plurality of memory blocks; selecting first memory blocks among the plurality of memory blocks according to the parameters; and copying data stored in the first memory blocks to second memory blocks among the plurality of memory blocks.

The checking of the parameters of the plurality of memory blocks may be performed by checking a first parameter and a second parameter of each of the plurality of memory blocks. The selecting of the first memory blocks may include: calculating a weighted first parameter of each of the plurality of memory blocks by giving to the first parameter a weight corresponding to the second parameter; and selecting the first memory blocks according to the weighted first parameter of each of the plurality of memory blocks.

The checking of the parameters of the plurality of memory blocks may be performed by checking a temperature of each of the plurality of memory blocks. The selecting of the first memory blocks may include: calculating a compensated first parameter of each of the plurality of memory blocks by compensating for the weighted first parameter by a temperature offset to the temperature; and selecting the first memory blocks according to the compensated first parameter of each of the plurality of memory blocks.

The operating method may further include: calculating a voltage offset of each of the plurality of memory blocks corresponding to the compensated first parameter; compensating for a read voltage for each of a plurality of read operations to be performed on the plurality of memory blocks by the voltage offset; and performing the plurality of read operations on the plurality of memory blocks through the read voltage compensated by the voltage offset.

The operating method may further include: calculating a voltage offset of each of the plurality of memory blocks corresponding to the weighted first parameter; compensating for a read voltage for each of a plurality of read operations to be performed on the plurality of memory blocks by the voltage offset; and performing the plurality of read operations on the plurality of memory blocks through the read voltage compensated by the voltage offset.

The checking of the parameters of the plurality of memory blocks may be performed by checking a first parameter and a second parameter of each of the plurality of memory blocks. The selecting of the first memory blocks may include: calculating a normalized first parameter of each of the plurality of memory blocks through the second parameter; and selecting the first memory blocks according to the normalized first parameter of each of the plurality of memory blocks.

The checking of the parameters of the plurality of memory blocks may be performed by checking a temperature of each of the plurality of memory blocks. The selecting of the first memory blocks may include: calculating a compensated first parameter of each of the plurality of memory blocks by compensating for the normalized first parameter by a temperature offset to the temperature; and selecting the first memory blocks according to the compensated first parameter of each of the plurality of memory blocks.

The operating method may further include: calculating a voltage offset of each of the plurality of memory blocks corresponding to the compensated first parameter; compensating for a read voltage for each of a plurality of read operations to be performed on the plurality of memory blocks by the voltage offset; and performing the plurality of read operations on the plurality of memory blocks through the read voltage compensated by the voltage offset.

The operating method may further include: calculating a voltage offset of each of the plurality of memory blocks corresponding to the normalized first parameter; compensating for a read voltage for each of a plurality of read operations to be performed on the plurality of memory blocks by the voltage offset; and performing the plurality of read operations on the plurality of memory blocks through the read voltage compensated by the voltage offset.

The checking of the parameters of the plurality of memory blocks may include: checking a minimum parameter, a maximum parameter and an average parameter of each of the plurality of pages included in each of the plurality of memory blocks; and selecting one of the minimum parameter, the maximum parameter and the average parameter as a representative parameter of each of the plurality of memory blocks. The selecting of the first memory blocks may be performed according to the representative parameter of each of the plurality of memory blocks.

BRIEF DESCRIPTION OF THE DRAWINGS

These and other features and advantages of the present invention will become apparent to those skilled in the art to which the present invention pertains from the following detailed description in reference to the accompanying drawings, wherein.

DETAILED DESCRIPTION

Figure 1:
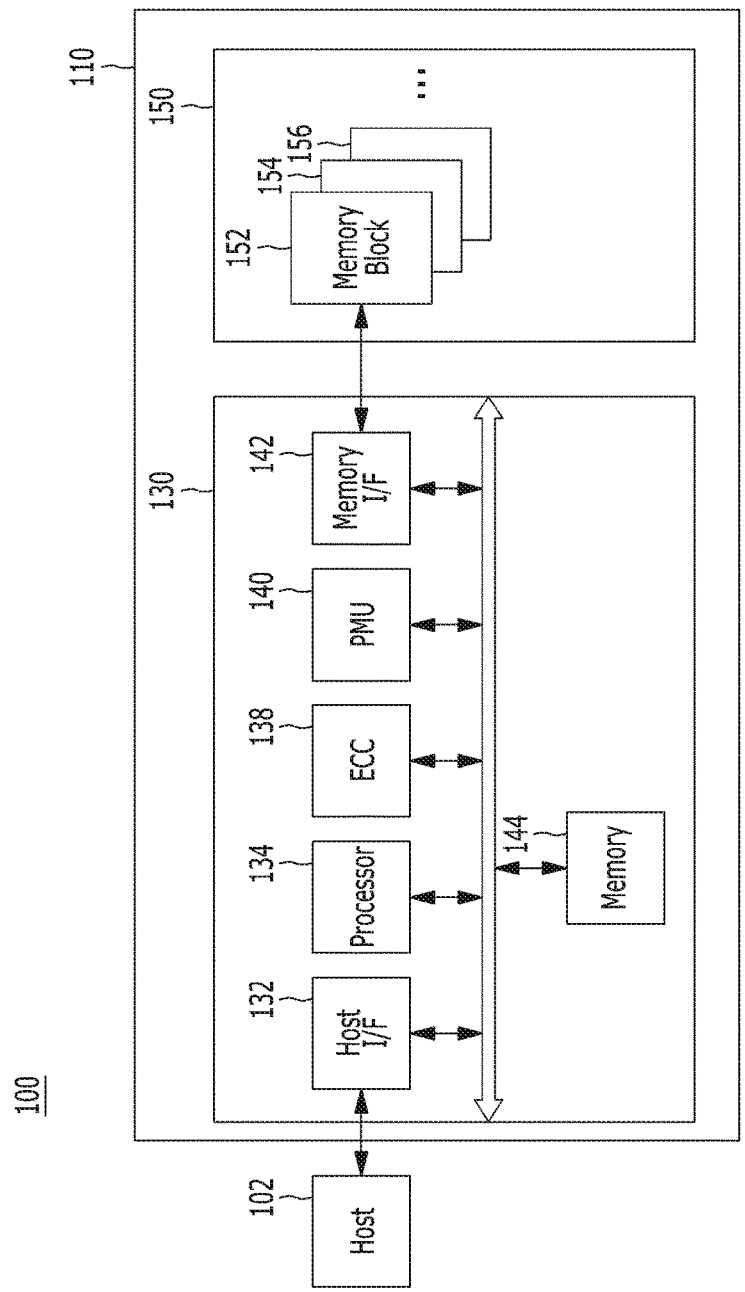
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may include, for example, portable electronic devices such as a mobile phone, MP3 player, and laptop computer or non-portable electronic devices such as a desktop computer, game machine, TV, and projector.

The memory system 110 may operate in response to a request of the host 102, and in particular, store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Examples of suitable storage devices include a solid state drive (SSD), a multimedia card (MMC), an embedded MMC (eMMC), a reduced size MMC (RS-MMC), a micro-MMC, a secure digital (SD) card, a mini-SD and a micro-SD card, a universal serial bus (USB) storage device, a universal flash storage (UFS) device, a compact flash (CF) card, a smart media (SM) card, a personal computer memory card international association (PCMCIA) card, a memory stick, and the like.

The memory system 110 may include various types of storage devices. Non-limited examples of storage devices included in the memory system 110 may include volatile memory devices such as a DRAM dynamic random access memory (DRAM) and a static RAM (SRAM), and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM), and a flash memory.

The memory system 110 may include a memory device 150, which stores data to be accessed by the host 102, and a controller 130, which may control storage of data in the memory device 150.

The controller 130 and the memory device 150 may be integrated into a single semiconductor device, which may be included in the various types of memory systems as exemplified above. For example, the controller 130 and the memory device 150 may be integrated as one semiconductor device to configure an SSD. When the memory system 110 is used as an SSD, the operating speed of the host 102 connected to the memory system 110 can be improved. In another example, the controller 130 and the memory device 150 may be integrated as one semiconductor device to configure a memory card. For example, the controller 130 and the memory device 150 may constitute a memory card such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device configuring a data center, a device capable of transmitting/receiving information under a wireless environment, one of various electronic devices configuring a home network, one of various electronic devices configuring a computer network, one of various electronic devices configuring a telematics network, a Radio Frequency Identification (RFID) device, or one of various component elements configuring a computing system.

The memory device 150 may be a nonvolatile memory device and may retain data stored therein even though power is not supplied. The memory device 150 may store data provided from the host 102 through a write operation, and provide data stored therein to the host 102 through a read operation. In an embodiment, the memory device 150 may include a plurality of memory dies (not shown), each memory may include a plurality of planes (not shown), each plane may include a plurality of memory blocks 152 to 156, each of the memory blocks 152 to 156 may include a plurality of pages, and each of the pages may include a plurality of memory cells to which a plurality of word lines (WL) are electrically coupled.

The controller 130 may control overall operations of the memory device 150 in response to a request from the host 102. More specifically, the controller may control a read operation, a write operation (also referred to as a program operation) and an erase operation of the memory device 150. For example, the controller 130 may provide the data read from the memory device 150 to the host 102, and/or may store data provided from the host 102 into the memory device 150.

The controller 130 may include a host interface (I/F) unit 132, a processor 134, an error correction code (KC) unit 138, a Power Management Unit (PMU) 140, a memory interface unit 142 such as a NAND flash controller (NFC), and a memory 144 all operatively coupled via an internal bus.

The host interface unit 132 may process a commands and data provided from the host 102, and may communicate with the host 102 through at least one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), small computer system interface (SCSI), enhanced small disk interface (ESDI), and integrated drive electronics (IDE). The host interface unit 132 may be driven via a firmware, that is, a host interface layer (HIL) for exchanging data with the host 102.

Further, the ECC unit 138 may correct error bits of data to be processed by the memory device 150 and may include an ECC encoder and an ECC decoder. The ECC encoder may perform an error correction encoding on data to be programmed into the memory device 150 to generate data to which a parity bit is added. The data including the parity bit may be stored in the memory device 150. The ECC decoder may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform an error correction operation based on a coded modulation such as Low Density Parity Check (LDPC) code, a Bose-Chaudhri-Hocquenghem (BCH) code, a turbo code, a Reed-Solomon (RS) code, convolution code, a Recursive Systematic Code (RSC), a Trellis-Coded Modulation (TCM), and a Block coded modulation (BCM), and so forth. However, the ECC unit 138 is not limited thereto. The ECC unit 138 may include all circuits, modules, systems, or devices for the error correction operation.

The PMU 140 may provide and manage power of the controller 130.

The memory interface unit 142 may serve as a memory/storage interface between the controller 130 and the memory device 150 to allow the controller 130 to control the memory device 150 in response to a request from the host 102. When the memory device 150 is a flash memory or specifically a NAND flash memory, the memory interface unit 142 may be a NAND flash controller (NFC) and may generate a control signal for the memory device 150 and process data to be provided to the memory device 150 under the control of the processor 134. The memory interface unit 142 may work as an interface (e.g., a NAND flash interface) for processing a command and data between the controller 130 and the memory device 150. Specifically, the memory interface unit 142 may support data transfer between the controller 130 and the memory device 150. The memory interface unit 142 may be driven via a firmware, that is, a flash interface layer (FIL) for exchanging data with the memory device 150.

The memory 144 may serve as a working memory of the memory system 110 and the controller 130, and store data for driving the memory system 110 and the controller 130. The controller 130 may control the memory device 150 to perform read, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be implemented with a volatile memory. For example, the memory 144 may be implemented with a static random access memory (SRAM) or a dynamic random access memory (DRAM). Although FIG. 1 illustrates the memory 144 disposed within the controller 130, the present disclosure is not limited thereto, and memory 144 may be disposed within or out of the controller 130. That is, in an embodiment, the memory 144 may be an external volatile memory having a memory interface transferring data between the memory 144 and the controller 130.

As described above, the memory 144 may include a program memory, a data memory, a write buffer/cache, a read buffer/cache, a data buffer/cache and a map buffer/cache to store data required to perform data write and read operations between the host 102 and the memory device 150 and data required for the controller 130 and the memory device 150 to perform these operations.

The processor 134 may control the overall operations of the memory system 110. The processor 134 may drive firmware to control the overall operations of the memory system 110. The firmware may be referred to as flash translation layer (FTL).

For example, the controller 130 may perform an operation requested by the host 102 in the memory device 150 through the processor 134, which is realized as a microprocessor or a CPU. In other words, the controller 130 may perform a command operation corresponding to a command received from the host 102. Herein, the controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command as a set command.

Also, the controller 130 may perform a background operation onto the memory device 150 through the processor 134, which is realized as a microprocessor or a CPU. Herein, the background operation performed onto the memory device 150 may include an operation of copying and processing data stored in some memory blocks among the memory blocks 152, 154 and 156 of the memory device 150 into other memory blocks, e.g., a garbage collection (GC) operation, an operation of performing swapping between the memory blocks 152, 154 and 156 of the memory device 150 or between the data of the memory blocks 152, 154 and 156, e.g., a wear-leveling (WL) operation, an operation of storing the map data stored in the controller 130 in the memory blocks 152, 154 and 156 of the memory device 150, e.g., a map flush operation, or an operation of managing bad blocks of the memory device 150, e.g., a bad block management operation of detecting and processing bad blocks among the memory blocks 152, 154 and 156 included in the memory device 150.

Also, in the memory system in accordance with the embodiment of the present invention, for instance, the controller 130 may perform a plurality of command executions corresponding to a plurality of commands received from the host 102, for example, a plurality of program operations corresponding to a plurality of write commands, a plurality of read operations corresponding to a plurality of read commands and a plurality of erase operations corresponding to a plurality of erase commands, in the memory device 150. Also, the controller 130 may update meta-data (particularly map data) according to the command executions. Particularly, in accordance with an embodiment of the present invention, when the controller 130 of the memory system 100 performs a plurality of command executions corresponding to a plurality of commands received from the host 102, for example, program operations, read operations, and erase operations on a plurality of memory blocks included in the memory device 150, there may occur a characteristics deterioration in the plurality of memory blocks due to the plurality of command executions and thus the operation reliability of the memory device 150 may be degraded. Therefore, the memory device 150 may perform a copy operation or a swap operation according to parameters of the memory device 150 corresponding to the plurality of command executions.

For example, in accordance with an embodiment of the present invention, when the controller 130 of the memory system 100 repeatedly performs the read operations on the plurality of memory blocks, particularly certain memory blocks included in the memory device 150 in response to a plurality of read commands received from the host 102, a read disturbance due to the repetitive read operations may occur in the certain memory blocks. Therefore, the controller 130 may perform a read reclaim operation on the certain memory blocks in order to prevent data loss of the certain memory blocks due to the read disturbance. That is to say, in accordance with an embodiment of the present invention, the controller 130 of the memory system 100 may perform a copy operation as a read reclaim operation of copying data stored in the certain memory blocks and store the copied data into another memory blocks in the memory device 150.

Here, in accordance with an embodiment of the present invention, the controller 130 of the memory system 100 may perform a read reclaim operation on the plurality of memory blocks according to a first parameter (e.g., a read count) corresponding to read operations performed on the plurality of memory blocks of the memory device 150 in response to the plurality of read commands received from the host 102. Particularly, the controller 130 may give a weight to the first parameter according to a second parameter (e.g., a program count or an erase count) corresponding to program operations and erase operations performed on the plurality of memory blocks of the memory device 150 in response to the plurality of write commands and read commands received from the host 102, or may normalize the first parameter using the second parameter. Also, the controller 130 may perform a copy operation as a read reclaim operation on the certain memory blocks of the plurality of memory blocks of the memory device 150 according to the weighted first parameter or the normalized first parameter. Further, the controller 130 may compensate for the weighted first parameter or the normalized first parameter by an environmental parameter (e.g., a temperature offset) of the memory system 110 or the memory device 150, and then may trigger a copy operation as a read reclaim operation for the plurality of memory blocks of the memory device 150. That is to say, the controller 130 may perform a copy operation as a read reclaim operation on the certain memory blocks of the plurality of memory blocks of the memory device 150 according to the environmental parameter as well as the first parameter and the second parameter.

Also, the controller 130 may compensate for read voltages for read operations to be performed on the plurality of memory blocks of the memory device 150 by voltage offsets for each level sector corresponding to the weighted first parameter or the normalized first parameter, and then may perform the read operations on the plurality of memory blocks of the memory device 150. That is to say, the controller 130 may perform an adaptive read operation on the plurality of memory blocks of the memory device 150 according to the first parameter and the second parameter. Further, as described above, the controller 130 may compensate for the weighted first parameter or the normalized first parameter by the temperature offset, may compensate for the read voltages for read operations to be performed on the plurality of memory blocks of the memory device 150 by the voltage offset for each level sector corresponding to the weighted first parameter or the normalized first parameter compensated by the temperature offset, and then may perform the read operations on the plurality of memory blocks of the memory device 150. That is to say, the controller 130 may perform the adaptive read operation on the plurality of memory blocks of the memory device 150 according to the environmental parameter, the first parameter, and the second parameter. Here, described with reference to FIGS. 5 to 9 will be a plurality of command executions to be performed in response to a plurality of commands received from the host 102 and a copy operation and a read operation to be performed on the memory device 150 according to the parameters corresponding to the performing of the plurality of command executions, that is, a remedial operation to be performed on the memory device 150 according to the parameters for a plurality of memory blocks of the memory device 150 in the memory system 110 in accordance with an embodiment of the present invention, and thus further description will be omitted now.

The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
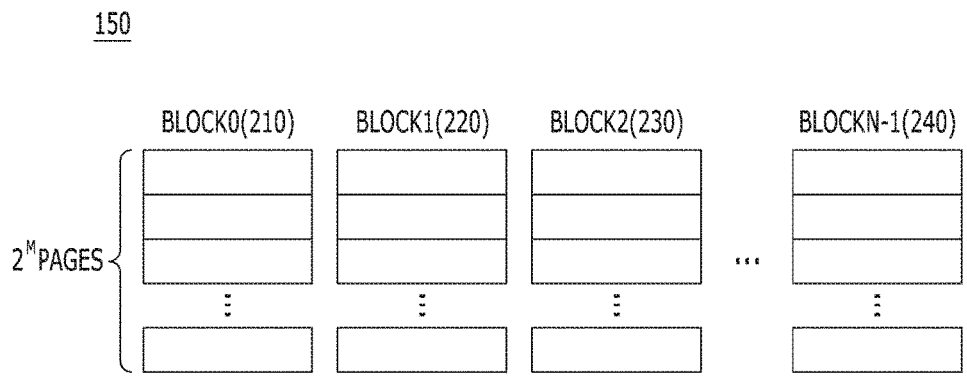
FIG. 2 is a schematic diagram illustrating an exemplary configuration of a memory device employed in the memory system shown in FIG. 1.

FIG. 2 is a schematic diagram illustrating the memory device 150.

Referring to FIG. 2, the memory device 150 may include a plurality of memory blocks BLOCK0 to BLOCKN−1, and each of the blocks BLOCK0 to BLOCKN−1 may include a plurality of pages, for example, $2^M$ pages, the number of which may vary according to circuit design. Memory cells included in the respective memory blocks 0 to N−1 may be one or more of a single level cell (SLC) storing 1-bit data, or a multi-level cell (MLC) storing 2- or more bit data. Hence, the memory device 150 may include SLC memory blocks or MLC memory blocks, depending on the number of bits which can be expressed or stored in each of the memory cells in the memory blocks. An SLC memory block may include a plurality of pages which are embodied by memory cells each storing one-bit data, and may generally have high data computing performance and high durability. An MLC memory block may include a plurality of pages which are embodied by memory cells each storing multi-bit data (for example, 2 or more bits), and may generally have a larger data storage space than the SLC memory block, that is, higher integration density. In an embodiment, the memory device 150 may include a plurality of Triple Level Cell (TLC) memory blocks. In yet another embodiment, the memory device 150 may include a plurality of Quadruple Level Cell (QLC) memory blocks. The TCL memory block may include a plurality of pages which are embodied by memory cells each capable of storing 3-bit data, the QLC memory block may include a plurality of pages which are embodied by memory cells each capable of storing 4-bit data. Although the embodiment of the present invention exemplarily describes, for the sake of convenience in description, that the memory device 150 may be the nonvolatile memory, such as a flash memory including NAND flash memory, it may implemented by any one of a phase change random access memory (PCRAM), a resistive random access memory (RRAM(ReRAM)), a ferroelectrics random access memory (FRAM), and a spin transfer torque magnetic random access memory (STT-RAM(STT-MRAM)).

Figure 3:
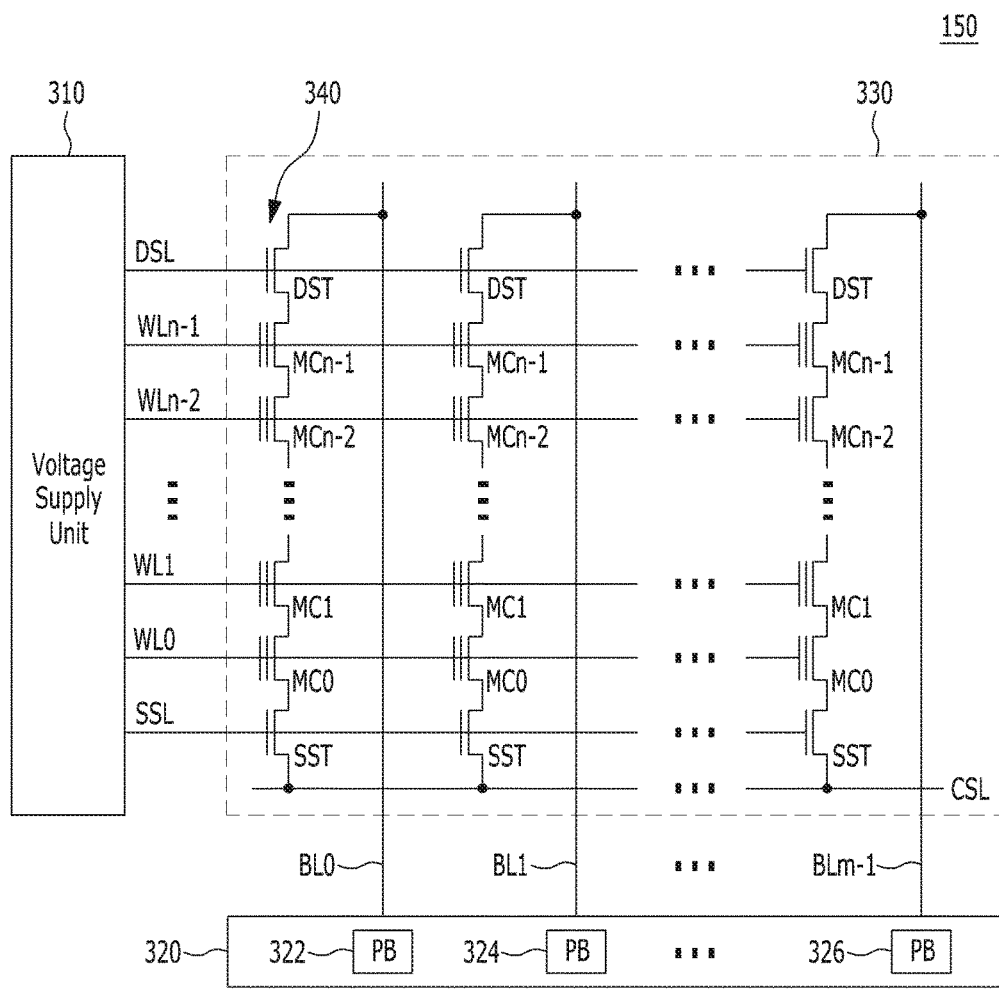
FIG. 3 is a circuit diagram illustrating an exemplary configuration of a memory cell array of a memory block in the memory device shown in FIG. 1.

FIG. 3 is a circuit diagram illustrating an exemplary configuration of a memory cell array of a memory block in the memory device 150 shown in FIG. 1.

Referring to FIG. 3, the memory block 330, which may correspond to any of the plurality of memory blocks 152 to 156 included in the memory device 150 of the memory system 110, may include a plurality of cell strings 340, which are electrically coupled to a plurality of corresponding bit lines BL0 to BLm−1. The cell string 340 of each column may include at least one drain select transistor DST and at least one source select transistor SST. Between the drain and source select transistors DST and SST, a plurality of memory cells or a plurality of memory cell transistors MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1. For reference, in FIG. 3, 'DSL' denotes a drain select line, 'SSL' denotes a source select line, and 'CSL' denotes a common source line.

While FIG. 3 only shows, as an example, the memory block 330 which is configured by NAND flash memory cells, it is to be noted that the memory block 152 of the memory device 150 according to the embodiment is not limited to NAND flash memory and may be realized by NOR flash memory, hybrid flash memory in which at least two kinds of memory cells are combined, or one-NAND flash memory in which a controller is built in a memory chip. The operational characteristics of a semiconductor device may be applied to not only a flash memory device in which a charge storing layer is configured by conductive floating gates but also a charge trap flash (CTF) in which a charge storing layer is configured by a dielectric layer.

The memory device 150 may further include a voltage supply unit 310 which provides word line voltages, for example, a program voltage, a read voltage, and a pass voltage to be supplied to the respective word lines according to an operation mode and voltages to be supplied to bulks, for example, well regions in which the memory cells are formed. The voltage supply unit 310 may perform a voltage generating operation under the control of a control circuit (not illustrated). The voltage supply unit 310 may generate a plurality of variable read voltages to generate a plurality of read data, may select one of the memory blocks (or sectors) of the memory cell array, select one of the word lines of the selected memory block, and provide the word line voltages to the selected word line and the unselected word lines as may be needed.

A read/write circuit 320 of the memory device 150 may be controlled by the control circuit, and may serve as a sense amplifier or a write driver according to an operation mode. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
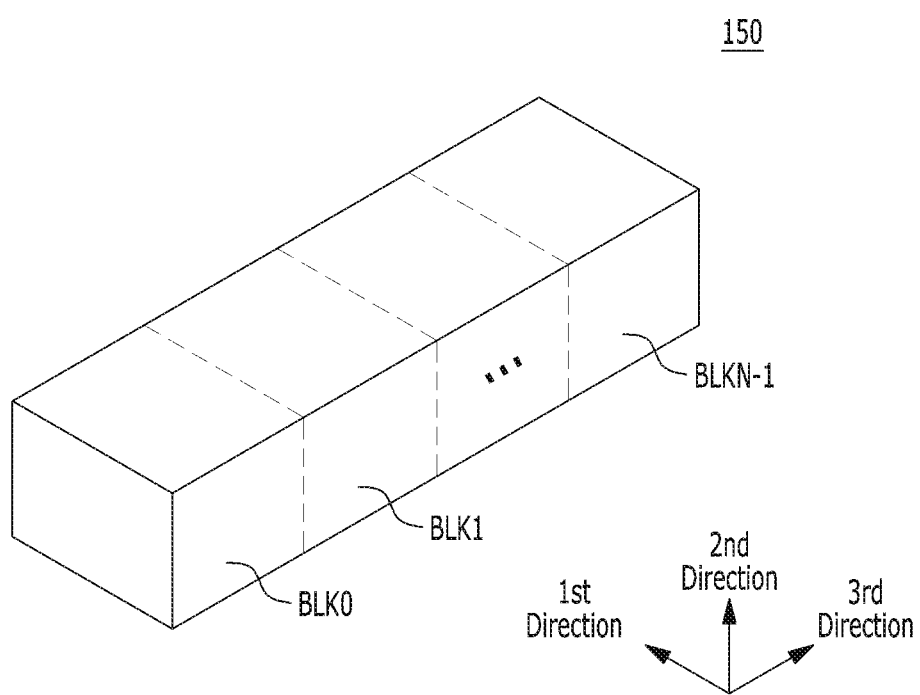
FIG. 4 is a schematic diagram illustrating an exemplary three-dimensional structure of the memory device shown in FIG. 2.

FIG. 4 is a schematic diagram illustrating an exemplary three-dimensional (3D) structure of the memory device 150.

The memory device 150 may be embodied by a two-dimensional (2D) or three-dimensional (3D) memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each having a 3D structure (or vertical structure).

Hereinbelow, detailed descriptions will be made with reference to FIGS. 5 to 9 for a data processing with respect to the memory device 150 in the memory system in accordance with the embodiment, particularly, a data processing operation when receiving a plurality of commands from the host 102 and performing a plurality of command executions corresponding to the plurality of commands.

FIGS. 5 to 8 are schematic diagrams illustrating a data processing operation where a plurality of command executions corresponding to a plurality of commands may be performed in a memory system in accordance with an embodiment. In the embodiment of the present disclosure the memory system 110 illustrated in FIG. 1 may receive a plurality of commands from the host 102 and perform a plurality of command executions corresponding to the plurality of commands. Particularly, the memory system 110 may receive a plurality of write commands from the host 102 to perform a plurality of program operations corresponding to the write commands, may receive a plurality of read commands from the host 102 to perform a plurality of read operations corresponding to the read commands, may receive a plurality of erase commands from the host 102 to perform a plurality of erase operations corresponding to the erase commands, or may receive together a plurality of write commands and a plurality of read commands from the host 102 to perform a plurality of program operations and read operations corresponding to the write commands and the read commands.

In accordance with the embodiment of the present disclosure, after storing write data corresponding to a plurality of write commands received from the host 102 in the buffers/caches included in the memory 144 of the controller 130, the data stored in the buffers/caches may be programmed and stored in the plurality of memory blocks included in the memory device 150 to perform program operation, and, after generating and updating map data according to the program operations for the memory device 150, the updated map data may be stored in the plurality of memory blocks included in the memory device 150. That is, program operations corresponding to a plurality of write commands received from the host 102 may be performed. Further, in the embodiment of the present disclosure, when a plurality of read commands are received from the host 102 for the data stored in the memory device 150, data corresponding to the read commands may be read from the memory device 150 by checking map data of the data corresponding to the read commands, and, after storing the read data in the buffers/caches included in the memory 144 of the controller 130, the data stored in the buffers/caches may be provided to the host 102. That is, read operations corresponding to a plurality of read commands received from the host 102 may be performed. In addition, in the embodiment of the present disclosure, when a plurality of erase commands are received from the host 102 for the memory blocks included in the memory device 150, memory blocks corresponding to the erase commands may be checked, data stored in the checked memory blocks may be erased, map data may be updated in correspondence to the erased data, and the updated map data may be stored in the plurality of memory blocks included in the memory device 150. That is, erase operations corresponding to a plurality of erase commands received from the host 102 may be performed.

Further, while, in the present embodiment, the controller 130 may perform a plurality of command executions in the memory system 110, it is to be noted that, as described above, the processor 134 included in the controller 130 may perform a data processing operation through, for example, a flash translation layer (FTL). For example, in the embodiment of the present disclosure, the controller 130 may program and store user data and metadata corresponding to write commands received from the host 102 into certain memory blocks selected from the plurality of memory blocks included in the memory device 150, may read the user data and metadata corresponding to read commands received from the host 102, from the certain memory blocks selected from the plurality of memory blocks included in the memory device 150, and may provide the read data to the host 102, or may erase the user data and metadata corresponding to erase commands received from the host 102, from the certain memory blocks selected from the plurality of memory blocks included in the memory device 150.

The metadata may include first map data including a logical to physical (L2P) information (hereinafter, referred to as a 'logical information') and second map data including a physical to logical (P2L) information (hereinafter, referred to as a 'physical information'), on the data stored in the memory blocks in correspondence to the program operation. Also, the metadata may include an information on the command data corresponding to the command received from the host 102, an information on the command execution corresponding to the command, an information on the memory blocks of the memory device 150 for which the command execution is to be performed, and an information on map data corresponding to the command execution. In other words, the metadata may include all remaining information and data, except for the user data corresponding to the command received from the host 102.

That is, in the embodiment of the present disclosure, the controller 130 may perform command executions corresponding to a plurality of commands received from the host. For example, the controller 130 may perform program operations corresponding to a plurality of write commands, when the write commands are received from the host 102. At this time, the user data corresponding to the write commands may be written and stored in the memory blocks of the memory device 150, for example, empty memory blocks, open memory blocks, or free memory blocks subject to an erase operation, among the memory blocks. Further, first map data including an L2P map table or an L2P map list and second map data including a P2L map table or a P2L map list may be written and stored in the empty memory blocks, open memory blocks, or free memory blocks among the memory blocks of the memory device 150. Logical information indicating mapping information between logical addresses and physical addresses for user data stored in the memory blocks may be recorded in the L2P map table or the L2P map list. Physical information indicating mapping information between physical addresses and logical addresses for the memory blocks storing the user data may be recorded in the P2L map table or the P2L map list.

Here, when receiving write commands from the host 102, the controller 130 may write and store user data corresponding to the write commands in memory blocks, and may store metadata including first map data and second map data associated with the user data stored in the memory blocks, in memory blocks. In particular, as the data segments of the user data are stored in the memory blocks of the memory device 150, the controller 130 may generate and update the meta segments of the metadata including the L2P segments of the first map data and the P2L segments of the second map data as the map segments of map data, and may store the map segments in the memory blocks of the memory device 150. At this time, the controller 130 may update the map segments stored in the memory blocks of the memory device 150, by loading them onto the memory 144 of the controller 130.

Further, when a plurality of read commands are received from the host 102, the controller 130 may read read data corresponding to the read commands, may store the read data in the buffers/caches included in the memory 144 of the controller 130, and then, may provide the data stored in the buffers/caches to the host 102, to perform read operations corresponding to the plurality of read commands.

In addition, when a plurality of erase commands are received from the host 102, the controller 130 may check memory blocks of the memory device 150 corresponding to the erase commands, and then may perform erase operations for the memory blocks.

Hereinbelow, detailed descriptions of the data processing operation in the memory system according to the present embodiment will be made with reference to FIGS. 5 to 8.

Figure 5:
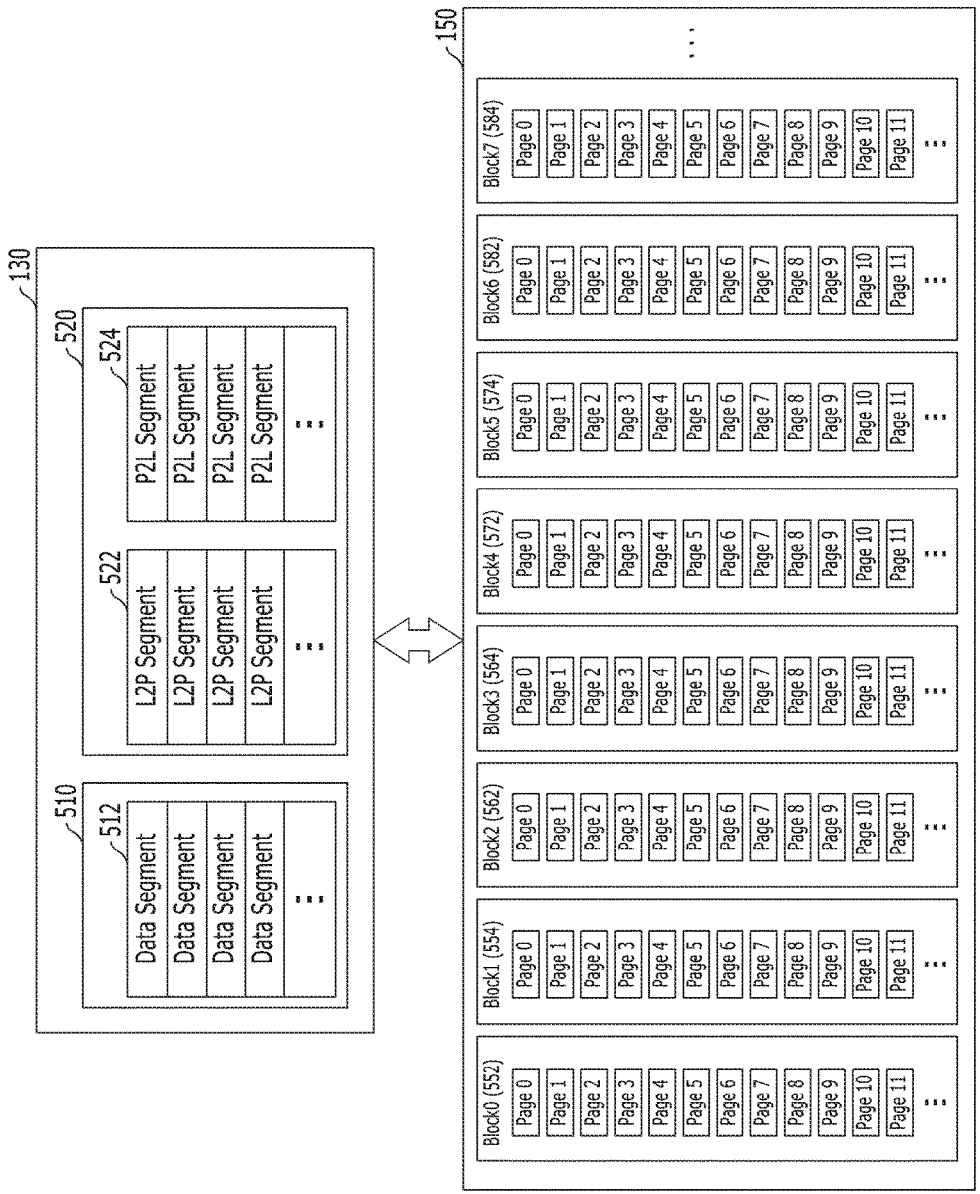
FIGS. 5 to 8 are schematic diagrams illustrating exemplary data processing operations corresponding to a plurality of commands in a memory system in accordance with an embodiment of the present invention.

First, referring to FIG. 5, the controller 130 may perform command executions corresponding to a plurality of commands received from the host 102, for example, program operations corresponding to a plurality of write commands received from the host 102. At this time, the controller 130 may program and store user data corresponding to the write commands, in memory blocks 552, 554, 562, 564, 572, 574, 582 and 584 (hereinafter, referred to as 'memory blocks 552 to 584') of the memory device 150. Also, with the program operation on the memory blocks 552 to 584, the controller 130 may generate and update metadata associated with the user data and may store the metadata in the memory blocks 552 to 584.

The controller 130 may generate and update first map data and second map data corresponding to information indicating that the user data have been stored in a plurality of pages included in the memory blocks 552 to 584. For example, the controller 130 may generate and update L2P segments indicating the logical segments of the first map data, and P2L segments indicating the physical segments of the second map data and then, may store the L2P segments and the P2L segments in the memory blocks 552 to 584.

For example, the controller 130 may cache and buffer the user data corresponding to the write commands received from the host 102, in a first buffer 510 included in the memory 144 of the controller 130. For example, the controller 130 may store data segments 512 of the user data in the first buffer 510 for buffering/caching data. Then, the controller 130 may store the data segments 512 stored in the first buffer 510, in the pages included in the memory blocks 552 to 584. As the data segments 512 of the user data corresponding to the write commands received from the host 102 are programmed and stored in the pages included in the memory blocks 552 to 584, the controller 130 may generate and update the first map data and the second map data, and may store the first map data and the second map data in a second buffer 520 included in the memory 144. Namely, the controller 130 may store L2P segments 522 of the first map data associated with the user data and P2L segments 524 of the second map data associated with the user data, in the second buffer 520 for map buffering/caching. The L2P segments 522 of the first map data and the P2L segments 524 of the second map data or a map list for the L2P segments 522 of the first map data and a map list for the P2L segments 524 of the second map data may be stored in the second buffer 520 in the memory 144. The controller 130 may store the L2P segments 522 of the first map data and the P2L segments 524 of the second map data of the second buffer 520, in the pages included in the memory blocks 552 to 584.

Also, the controller 130 may perform command executions corresponding to a plurality of commands received from the host 102, for example, read operations corresponding to a plurality of read commands received from the host 102. At this time, the controller 130 may load the map segments of the map data associated with the user data corresponding to the read commands onto the second buffer 520. For example, the controller 130 may load L2P segments 522 of first map data and P2L segments 524 of second map data, onto the second buffer 520, and may check the L2P segments 522 and the P2L segments 524. After that, the controller 130 may read the user data associated with the first map data and the second map data from the pages of the memory blocks 552 to 584, may store data segments 512 of the read user data in the first buffer 510, and may provide the data segments 512 to the host 102.

Furthermore, the controller 130 may perform command executions corresponding to a plurality of commands received from the host 102, for example, erase operations corresponding to a plurality of erase commands received from the host 102. At this time, the controller 130 may check memory blocks corresponding to the erase commands among the memory blocks 552 to 584, and may perform the erase operations for the checked memory blocks.

Still further, when a background operation of copying or swapping data stored in a plurality of memory blocks of the memory device 150, for example, a garbage collection operation or a wear-leveling operation is performed, the controller 130 may store data segments 512 of user data into the first buffer 510, may load the map segments 522 and 524 of the map data associated with the user data onto the second buffer 520, and may perform a garbage collection operation or a wear-leveling operation on the plurality of memory blocks of the memory device 150.

Figure 6:
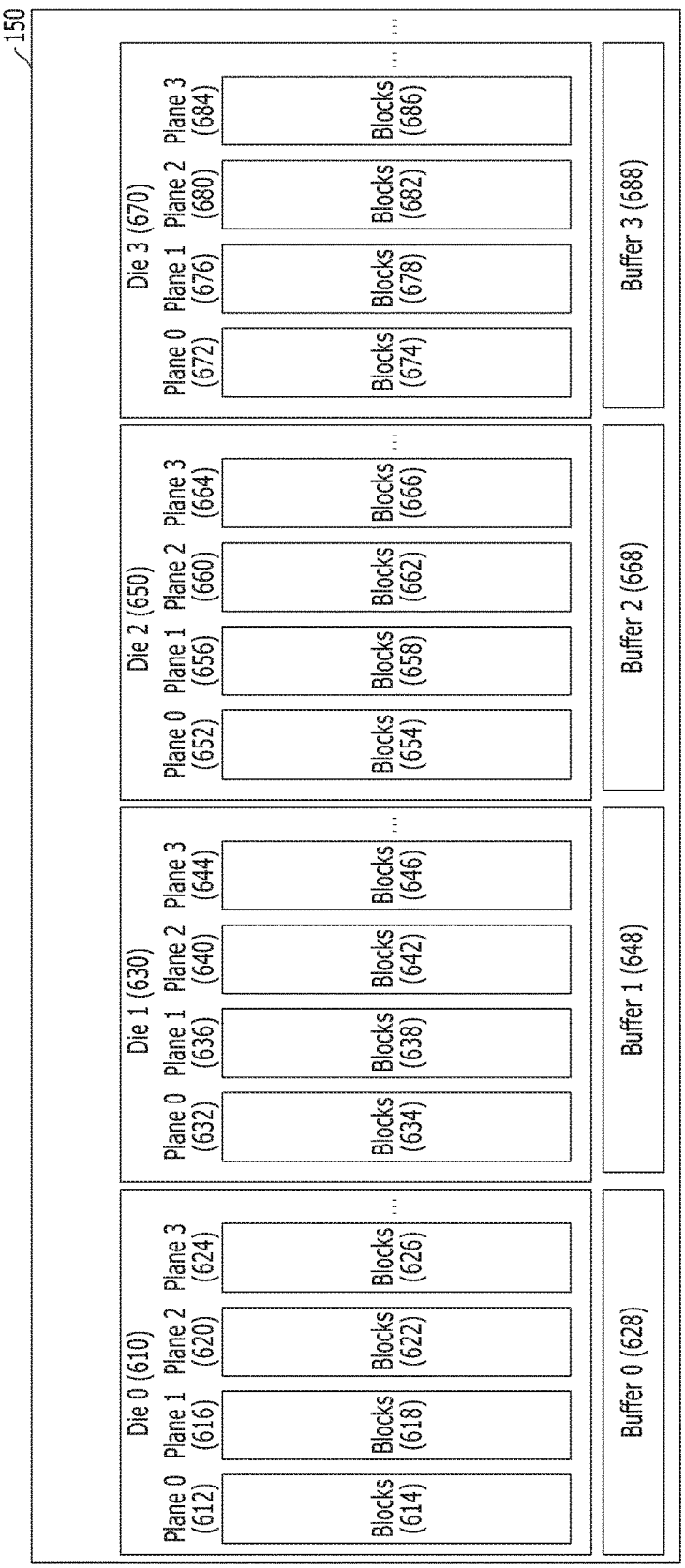

Referring to FIG. 6, the memory device 150 may include a plurality of memory dies, for example, a memory die 0 610, a memory die 1 630, a memory die 2 650, and a memory die 3 670. Each of the memory dies 610, 630, 650 and 670 (hereinafter, referred to as 'memory dies 610 to 670') may include a plurality of planes. For example, the memory die 0 610 may include a plane 0 612, a plane 1 616, a plane 2 620, and a plane 3 624. The memory die 1 630 may include a plane 0 632, a plane 1 636, a plane 2 640, and a plane 3 644. The memory die 2 650 may include a plane 0 652, a plane 1 656, a plane 2 660, and a plane 3 664. The memory die 3 670 may include a plane 0 672, a plane 1 676, a plane 2 680, and a plane 3 684. The respective planes 612, 616, 620, 624, 632, 636, 640, 644, 652, 656, 660, 664, 672, 676, 680 and 684 (hereinafter, referred to as 'planes 12 to 684') in the memory dies 610 to 670 may include a plurality of memory blocks 614, 618, 622, 626, 634, 638, 642, 646, 654, 658, 662, 666, 674, 678, 682 and 686 (hereinafter, referred to as 'memory blocks 614 to 686'), for example, N number of blocks Block0, Block1, . . . and BlockN−1 each including a plurality of pages, for example, 2^M number of pages, as described above with reference to FIG. 2. Moreover, the memory device 150 may include a plurality of buffers corresponding to the respective memory dies 610 to 670. For example, a buffer 0 628 may correspond to the memory die 0 610, a buffer 1 648 may correspond to the memory die 1 630, a buffer 2 668 may correspond to the memory die 2 650, and a buffer 3 688 may correspond to the memory die 3 670.

In the case of performing command executions corresponding to a plurality of commands received from the host 102, data corresponding to the command executions may be stored in the buffers 628, 648, 668 and 688 (hereinafter, referred to as 'buffers 628 to 688'). For example, in the case of performing program operations, data corresponding to the program operations may be stored in the buffers 628 to 688, and may be then stored in the pages included in the memory blocks of the memory dies 610 to 670. In the case of performing read operations, data corresponding to the read operations may be read from the pages included in the memory blocks of the memory dies 610 to 670, may be stored in the buffers 628 to 688, and may be then provided to the host 102 through the controller 130.

In an embodiment of the present disclosure, the buffers 628 to 688 may be separated from the respective corresponding memory dies 610 to 670. In another embodiment of the present disclosure, each of the buffers 628 to 688 may be incorporated into the respective corresponding memory dies 610 to 670. In one another embodiment of the present disclosure, the buffers 628 to 688 may correspond to the respective planes 612 to 684 or the respective memory blocks 614 to 686 in the respective memory dies 610 to 670. Further, in an embodiment of the present disclosure, the buffers 628 to 688 included in the memory device 150 may correspond to the plurality of page buffers 322, 324, and 326 included in the memory device 150, described above with reference to FIG. 3. However, the present disclosure is not limited thereto. That is, in another embodiment of the present disclosure, the buffers 628 to 688 may correspond to a plurality of caches or a plurality of registers included in the memory device 150.

Further, the plurality of memory blocks of the memory device 150 may be grouped into a plurality of super memory blocks, and a plurality of command executions may be performed on the plurality of super memory blocks. Here, each of the plurality of super memory blocks may include a plurality of memory blocks. For example, each of the plurality of super memory blocks may include a plurality of memory blocks included in both a first group of memory blocks and a second group of memory blocks. When the first group of memory blocks is included in a first plane of a first memory die, the second group of memory block may be included in the first plane of the first memory die, may be included in a second plane of the first memory die, or may be included in planes of a second memory die.

Figure 7:
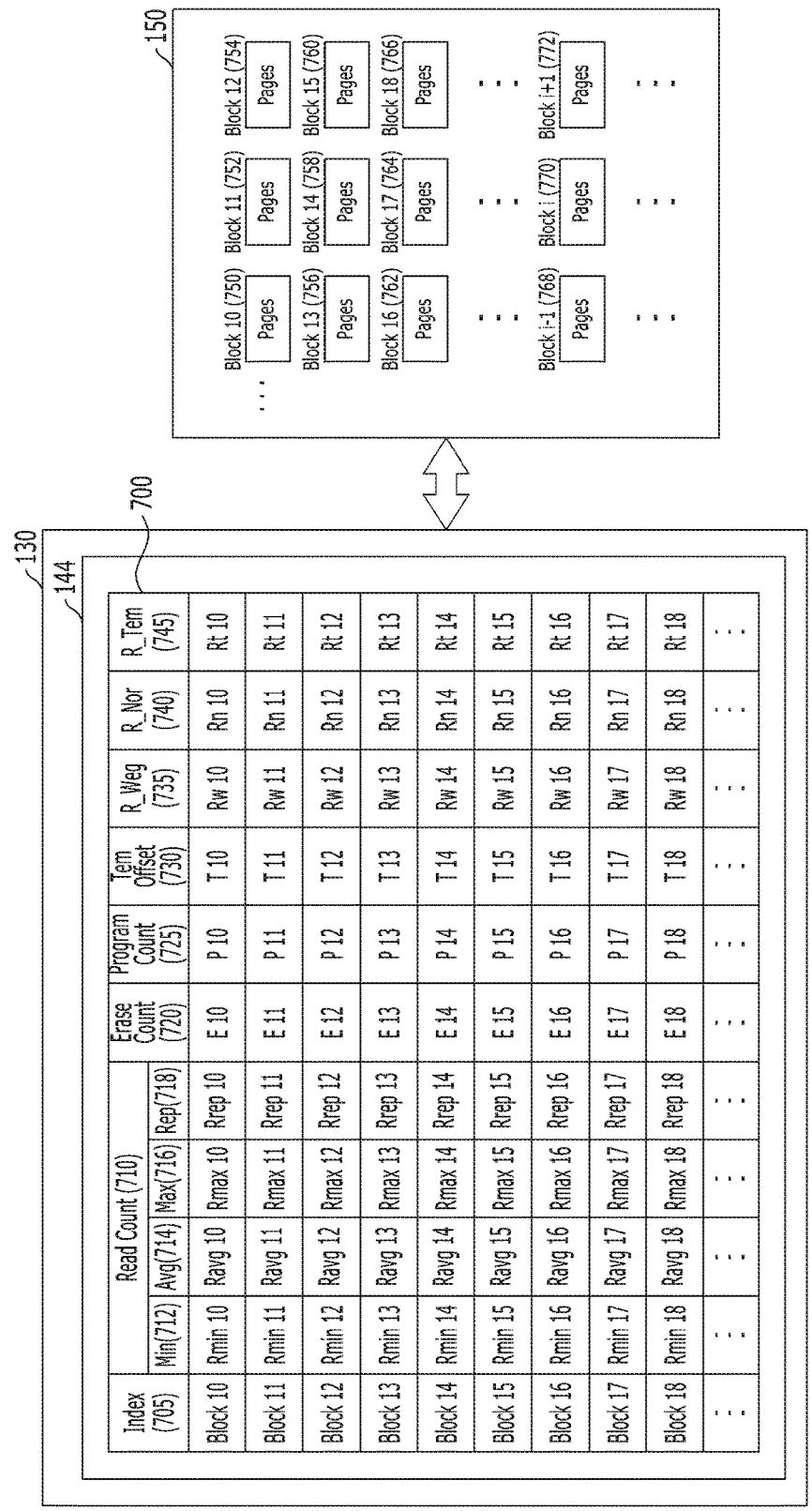
Figure 8:
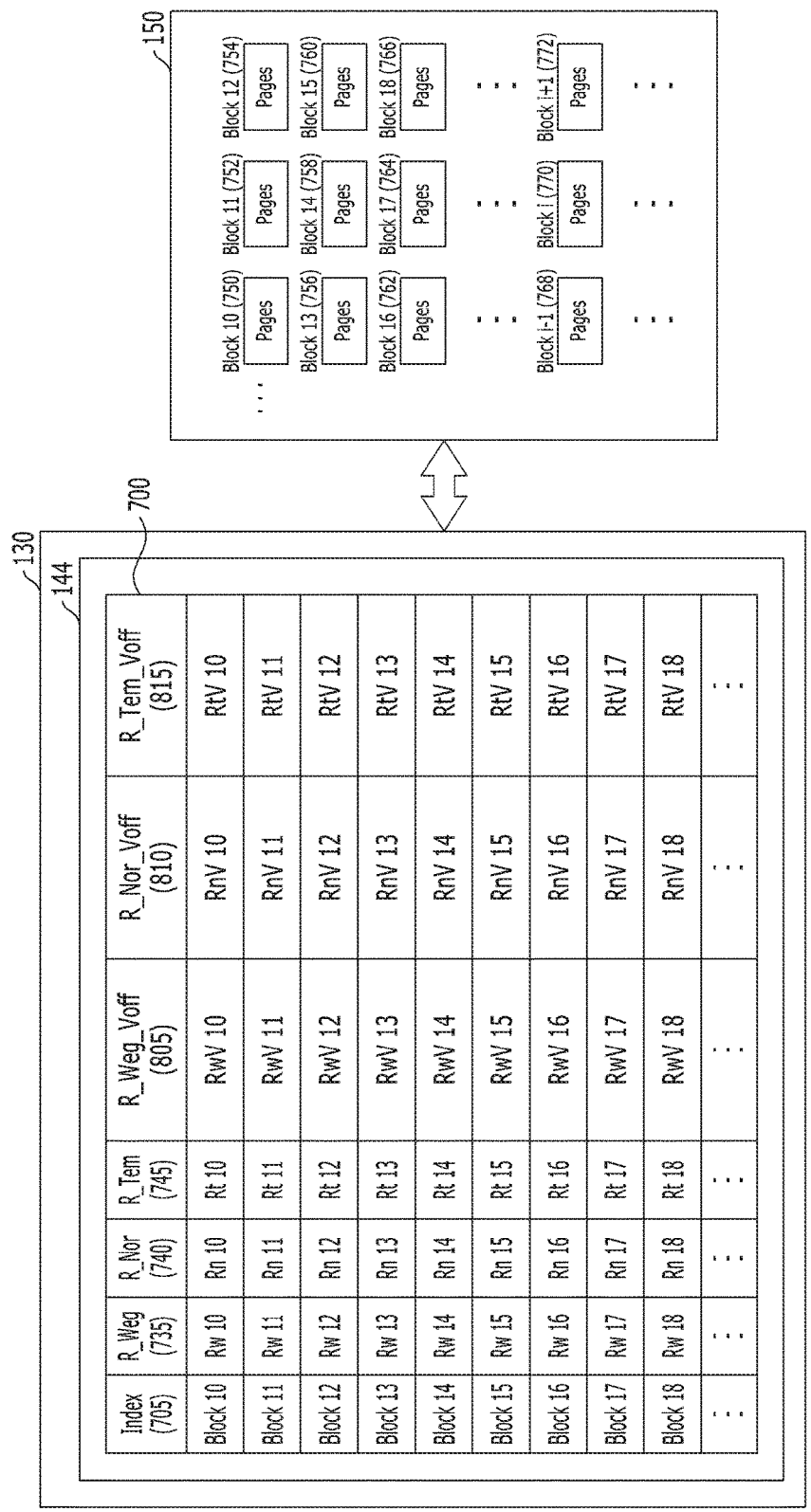

Referring to FIGS. 7 and 8, when the controller 130 receives a plurality of commands (e.g., a plurality of write commands, a plurality of read commands, and a plurality of erase commands) from the host 102, the controller 130 may perform a plurality of command executions (e.g., a plurality of program operations, a plurality of read operations, and a plurality of erase operations) on the plurality of memory blocks of the memory device 150 in response to the plurality of commands. Further, the controller 130 may check parameters of the plurality of memory blocks of the memory device 150 according to the plurality of command executions performed on the plurality of memory blocks of the memory device 150 and then may manage the parameters. Also, the controller 130 may perform a copy operation as a read reclaim operation on the plurality of memory blocks of the memory device 150 based on the parameters. Also, the controller 130 may perform an adaptive read operation on the plurality of memory blocks of the memory device 150 based on the parameters of the plurality of memory blocks of the memory device 150.

Particularly, the controller 130 may perform a plurality of command executions on the plurality of memory blocks of the memory device 150, for example, a memory block 10 750, a memory block 11 752, a memory block 12 754, a memory block 13 756, a memory block 14 758, a memory block 15 760, a memory block 16 762, a memory block 17 764, and a memory block 18 766 (hereinafter, referred to as 'memory blocks 750 to 766'), in response to the plurality of commands received from the host 102. Further, the controller 130 may check parameters of the plurality of memory blocks 750 to 766 according to the plurality of command executions performed on the plurality of memory blocks 750 to 766 and then may manage the parameters. Particularly, the controller 130 may store in a parameter table 700 the parameters of the plurality of memory blocks 750 to 766 according to an index 705 of the plurality of memory blocks 750 to 766, and then may manage the parameters. Here, the parameter table 700 may be meta-data of the memory device 150. Accordingly, the parameter table 700 may be stored in the second buffer 520 included in the memory 144 of the controller 130 and may also be stored in the memory device 150.

For example, as described above, when the controller 130 receives a plurality of read commands from the host 102, it may perform a plurality of read operations of reading data corresponding to the plurality of read commands from a plurality of pages included in the plurality of memory blocks 750 to 766 and providing the read data to the host 102 in response to the plurality of read commands from the host 102. Here, the controller 130 may list into the parameter table 700 the first parameter, for example, a read count 710 of each of the plurality of memory blocks 750 to 766 according to the plurality of read operations performed on the plurality of memory blocks 750 to 766. Particularly, the controller 130 may check the read count 710 for each memory cell or page in each of the plurality of memory blocks 750 to 766, by performing the plurality of read operations on the memory cells or the pages of the plurality of memory blocks 750 to 766 storing the data corresponding to each of the plurality of read commands, among a plurality of pages included in each of the plurality of memory blocks 750 to 766. That is to say, when the controller 130 performs a plurality of read operations on a plurality of pages in each of the plurality of memory blocks 750 to 766, it may check the read count 710 of each of memory cells or each of pages in each of the plurality of memory blocks 750 to 766. Also, the controller 130 may list the read count 705 of each of the plurality of memory blocks 750 to 766 into the parameter table 700 according to the index 705 of the plurality of memory blocks 750 to 766. Particularly, the controller 130 may list a minimum read count 712, a maximum read count 716 and an average read count 714 of each of the plurality of memory blocks 750 to 766 into the parameter table 700 according to the index 705 of the plurality of memory blocks 750 to 766. Further, the controller 130 may list as a representative read count 718 one of the minimum read count 712, the maximum read count 716, and the average read count 714 into the parameter table 700 according to the index 705.

Here, the minimum read count 712 of each of the plurality of memory blocks 750 to 766 may indicate a read count of a page or a memory cell having a minimum read count among memory cells or pages included in each of the plurality of memory blocks 750 to 766. Also, the maximum read count 716 of each of the plurality of memory blocks 750 to 766 may indicate a read count of a page or a memory cell having a maximum read count among memory cells or pages included in each of the plurality of memory blocks 750 to 766. Further, the average read count 714 of each of the plurality of memory blocks 750 to 766 may indicate an average value of whole read counts of memory cells or pages included in each of the plurality of memory blocks 750 to 766. Further, the representative read count 718 of each of the plurality of memory blocks 750 to 766 may be the first parameter of each of the plurality of memory blocks 750 to 766, as described above. Therefore, the controller 130 may perform a copy operation as a read reclaim operation and an adaptive read operation or a remedial operation on the plurality of memory blocks 750 to 766 according to the first parameter or the representative read count 718.

Further, as described above, when the controller 130 receives a plurality of write commands from the host 102, it may perform a plurality of program operations of storing data corresponding to the write commands into a plurality of pages included in the plurality of memory blocks 750 to 766 in response to the plurality of write commands. Here, the controller 130 may list into the parameter table 700 the second parameter, for example, a program count 725 of each of the plurality of memory blocks 750 to 766 according to the plurality of program operations performed on the plurality of memory blocks 750 to 766. Particularly, the controller 130 may check the program count 725 of each of the plurality of memory blocks 750 to 766 according to the plurality of program operations performed on the plurality of memory blocks 750 to 766 of the memory device 150 in response to the plurality of write commands. Also, the controller 130 may list the program count 725 into the parameter table 700 according to the index 705 of the plurality of memory blocks 750 to 766. Further, the controller 130 may initialize the read count 710 of the memory blocks subject to the plurality of program operations, among the plurality of memory blocks 750 to 766, the read count 710 being listed in the parameter table 700. Particularly, the controller 130 may initialize the read count 710 of each memory cell or each page included in the memory blocks subject to the plurality of program operations, among memory cell or pages included in each of the plurality of memory blocks 750 to 766, the read count 701 being listed in the parameter table 700. For example, when a program operation is performed on the memory block 11 752, the controller 130 may initialize the read count 710 of the memory block 11 752, as listed in the parameter table 700. That is, when a program operation is performed on the memory block 11 752, the controller 130 may initialize the minimum read count Rmin11, the average read count Ravg11, the maximum read count Rmax11, and the representative read count Rrep11 of the memory block 11 752, all of which are listed in the parameter table 700.

Further, as described above, when the controller 130 receives a plurality of erase commands from the host 102, the controller 130 may perform a plurality of erase operations of erasing data corresponding to the erase commands from the plurality of memory blocks 750 to 766 of the memory device 150 in response to the plurality of erase commands. Here, the controller 130 may list into the parameter table 700 the second parameter, for example, an erase count 720 of each of the plurality of memory blocks 750 to 766 according to the plurality of erase operations performed on the plurality of memory blocks 750 to 766. Particularly, the controller 130 may check the erase count 720 of each of the plurality of memory blocks 750 to 766 according to the plurality of erase operations performed on the plurality of memory blocks 750 to 766 in response to the plurality of erase commands. Also, the controller 130 may list the erase count 720 of each of the plurality of memory blocks 750 to 766 into the parameter table 700 according to the index 705 of the plurality of memory blocks 750 to 766. Further, the controller 130 may initialize the read count 710 of the memory blocks subject to the plurality of erase operations, among the plurality of memory blocks 750 to 766, the read count 701 being listed in the parameter table 700. For example, when an erase operation is performed on the memory block 14 758, the controller 130 may initialize the read count 710 of the memory block 14 758, as listed in the parameter table 700. That is, when an erase operation is performed on the memory block 14 758, the controller 130 may initialize the minimum read count Rmin14, the average read count Ravg14, the maximum read count Rmax14 and the representative read count Rrep14 of the memory block 14 758, all of which are listed in the parameter table 700.

Further, as described above, when the controller 130 performs a plurality of command executions on the plurality of memory blocks 750 to 766 of the memory device 150 in response to the plurality of command received from the host 102, the controller 130 may check the environmental parameter, for example, a temperature of the memory system 110 or the memory device 150 according to the plurality of command executions performed on the plurality of memory blocks 750 to 766 in response to the plurality of commands. Also, the controller 130 may list a temperature offset 730 corresponding to the temperature of the memory system 110 or the memory device 150 into the parameter table 700 according to the index 705 of the plurality of memory blocks 750 to 766. That is to say, when the controller 130 performs a plurality of command executions on the plurality of memory blocks 750 to 766 of the memory device 150 in response to the plurality of command received from the host 102, it may check a temperature of the memory system 110 or the memory device 150 using a temperature sensor included in the memory system 110. Particularly, the temperature sensor may be included in the controller 130 or the memory device 150. Also, when the plurality of command executions are performed on the plurality of memory blocks 750 to 766 of the memory device 150, the controller 130 may list the temperature offset 730 corresponding to the temperature of each of the plurality of memory blocks 750 to 766 into the parameter table 700 according to the index 705 of the plurality of memory blocks 750 to 766.

Further, the controller 130 may give to the first parameter indicating the representative read count 718 of the read count 710 listed in the parameter table 700 a weight corresponding to the second parameter indicating the program count 725 or the erase count 720. That is, the controller 130 may give a weight corresponding to the second parameter to the first parameter. Also, the controller 130 may list into the parameter table 700 the weighted first parameter 735 indicating the first parameter with the weight corresponding to the second parameter. For example, the controller 130 may give weights W10, W13, and W16 to the representative counts Rep10, ReP13 and Rep16, respectively. The weights W10, W13, and W16 may correspond to program counts P10, P13, and P16 or erase counts E10, E13, and E16 of the memory block 10 750, the memory block 13 756 and the memory block 16 762, respectively. Also, the controller 130 may calculate the weighted first parameters Rw10 (e.g., Rw10=Rep10*W10 (W10=0.7)), Rw13 (e.g., Rw13=Rep13*W13 (W13=1.0)) and Rw16 (e.g., Rw16=Rep16*W16 (W16=1.2)) of the memory block 10 750, the memory block 13 756, and the memory block 16 762, respectively. Then, the controller 130 may list into the parameter table 700 the weighted first parameters Rw10, Rw13 and Rw16 of the memory block 10 750, the memory block 13 756, and the memory block 16 762, respectively.

Further, the controller 130 may normalize the first parameter indicating the representative read count 718 of the read count 710 through the second parameter indicating the program count 725 or the erase count 720. Also, the controller 130 may list the normalized first parameter 740 into the parameter table 700. For example, the controller 130 may normalize the representative read counts Rep12, ReP15, and Rep18 through the program counts P12, P15, and P18 or the erase counts E12, E15, and E18 of the memory block 12 754, the memory block 15 760 and the memory block 18 766. The controller 130 may calculate the normalized first parameters Rn12 (e.g., Rn12=Rep12*P12/E12), Rn15 (e.g., Rn15=Rep15*P15/E15), Rn18 (e.g., Rn18=Rep18*P18/E18), respectively. Then the controller 130 may list the normalized first parameters Rn12, Rn15, and Rn18 of the memory block 12 754, the memory block 15 760, and the memory block 18 766 into the parameter table 700, respectively.

Further, the controller 130 may compensate for the weighted first parameter 735 or the normalized first parameter 740 listed in the parameter table 700 by the environmental parameter, for example, the temperature offset 730 corresponding to a temperature. Also, the controller 130 may list a compensated first parameter 745 indicating the weighted first parameter 735 or the normalized first parameter 740 compensated by the temperature offset 730, into the parameter table 700. For example, the controller 130 may compensate for the weighted first parameters Rw11, Rw14, and Rw17 or the normalized first parameters Rn11, Rn14, and Rn17 of the memory block 11 752, the memory block 14 758, and the memory block 17 764, respectively, by the temperature offsets T11, T14, and T17. The controller 130 may calculate the compensated first parameters Rt11 (e.g., Rt11=Rw11+T11 or Rt11=Rn11+T11), Rt14, (e.g., Rt14=Rw14+T14 or Rt14=Rn14+T14) and Rt17 (e.g., Rt14=Rw14+T14 or Rt14=Rn14+T14) of the memory block 11 752, the memory block 14 758 and the memory block 17 764, respectively. Then, the controller 130 may list the compensated first parameters Rt11, Rt14, and Rt17 into the parameter table 700.

Further, the controller 130 may calculate a voltage offset corresponding to the weighted first parameter 735 listed in the parameter table 700 for each level sector, and may list a weighted first voltage offset 805 indicating the voltage offset corresponding to the weighted first parameter 735, into the parameter table 700. For example, for each level sector V10, V13, and V16, the controller 130 may calculate the weighted first voltage offsets RwV10, RwV13, and RwV16 corresponding to the weighted first parameters Rw10, Rw13 and Rw16 of the memory block 10 750, the memory block 13 756 and the memory block 16 762, respectively. Then, the controller 130 may list the weighted first voltage offsets RwV10, RwV13, and RwV16 into the parameter table 700, respectively.

Further, the controller 130 may calculate a voltage offset corresponding to the normalized first parameter 740 listed in the parameter table 700, for each level sector, and may list a normalized first voltage offset 810 indicating the voltage offset corresponding to the normalized first parameter 740, into the parameter table 700. For example, for each level sector V12, V15, and V18, the controller 130 may calculate the normalized first voltage offsets RnV12, RnV15, and RnV18 corresponding to the normalized first parameters Rn12, Rn15, and Rn18 of the memory block 12 754, the memory block 15 760, and the memory block 18 766, respectively. Then, the controller 130 may list the normalized first voltage offsets RnV12, RnV15, and RnV18 into the parameter table 700, respectively.

Further, the controller 130 may calculate a voltage offset corresponding to the compensated first parameter 745 listed in the parameter table 700, for each level sector, and may list a compensated first voltage offset 815 indicating the voltage offset corresponding to the compensated first parameter 745, into the parameter table 700. For example, for each level sector V11, V14, and V17, the controller 130 may calculate the compensated first voltage offsets RtV11, RtV14, and RtV17 corresponding to the compensated first parameters Rt11, Rt14, and Rt17 of the memory block 11 752, the memory block 14 758, and the memory block 17 764, respectively. Then, the controller 130 may list the compensated first voltage offsets RtV11, RtV14, and RtV17 into the parameter table 700, respectively.

As described above, the controller 130 may check the first parameter indicating the read count 710 of each of the plurality of memory blocks 750 to 766 of the memory device 150; the second parameter indicating the program count 725 or the erase count 720 of each of the plurality of memory blocks 750 to 766 of the memory device 150; and the temperature offset 730 corresponding to the temperature of the memory system 110 or the memory device 150 according to a plurality of command executions performed on the plurality of memory blocks 750 to 766 of the memory device 150 in response to a plurality of commands received from the host 102. Also, the controller 130 may calculate the weighted first parameter 735 and the normalized first parameter 740 through the second parameter, and may calculate the compensated first parameter 745 for the weighted first parameter 735 and the normalized first parameter 740 through the temperature offset 730.

Further, the controller 130 may check the read count 710, particularly the representative read count 718, as the first parameter of each of the plurality of memory blocks 750 to 766 of the memory device 150. Then, the controller 130 may perform a copy operation as a read reclaim operation on the plurality of memory blocks 750 to 766 according to the representative read count 718. For example, the controller 130 may select as source memory blocks memory blocks, a plurality of memory blocks each having representative read count 718 greater than a threshold count, among the plurality of memory blocks 750 to 766. Then, the controller 130 may copy data, particularly valid data stored in the source memory blocks, and may store the copied data into target memory blocks, for example, a memory block 'i−1' 768, a memory block 'i' 770 and a memory block 'i+1' 772. Here, the memory block 'i−1' 768, the memory block 'i' 770 and the memory block 'i+1' 772 may be empty memory blocks, open memory blocks or free memory blocks, as the target memory blocks. Therefore, the data stored in the source memory blocks may be copied and stored into empty memory blocks, open memory blocks or free memory blocks.

Moreover, the controller 130 may perform a copy operation as a read reclaim operation on the plurality of memory blocks 750 to 766 of the memory device 150 according to the first parameter, particularly the representative read count 718 of the read count 710, the second parameter, for example the program count 725 or the erase count 720, and the temperature offset 730 corresponding to the temperature of each of the plurality of memory blocks 750 to 766 of the memory device 150. For example, the controller 130 may select as source memory blocks, a plurality of memory blocks having the weighted first parameter 735, the normalized first parameter 740, or the compensated first parameter 745 greater than a threshold value, among the plurality of memory blocks 750 to 766 of the memory device 150. Then, the controller 130 may copy data, particularly valid data stored in the source memory blocks, and may store the copied data into target memory blocks, for example, a memory block 'i−1' 768, a memory block 'i' 770, and a memory block 'i+1' 772.

Moreover, the controller 130 may perform an adaptive read operation on the plurality of memory blocks 750 to 766 of the memory device 150 according to the first parameter, particularly the representative read count 718 of the read count 710, the second parameter, for example the program count 725 or the erase count 720, and the temperature offset 730 corresponding to the temperature of each of the plurality of memory blocks 750 to 766 of the memory device 150. For example, when the controller 130 performs a plurality of read operations on the plurality of memory blocks 750 to 766 of the memory device 150, respectively, it may compensate for read voltages for the plurality of read operations to be performed on the plurality of memory blocks 750 to 766 of the memory device 150, respectively, by the weighted first voltage offsets, the normalized first voltage offsets, or the compensated first voltage offsets and then may perform a plurality of read operations on the plurality of memory blocks 750 to 766 of the memory device 150, respectively.

As described above, in accordance with an embodiment of the present invention, when the controller 130 of the memory system 100 performs a plurality of command executions in response to a plurality of commands received from the host 102, it may check a parameter of each of a plurality of memory blocks 750 to 766 of the memory device 150, may give a weight to the parameter or may normalize the parameter, may compensate for the parameter by a temperature offset, and may perform a copy operation as a read reclaim operation on each of the plurality of memory blocks 750 to 766 of the memory device 150 according to the weighted parameter or the normalized parameter and the parameter compensated by the temperature offset. Moreover, in accordance with an embodiment of the present invention, the controller 130 of the memory system 100 may compensate for a read voltage for a read operation to each of the plurality of memory blocks 750 to 766 of the memory device 150, by a voltage offset corresponding to the weighted parameter or the normalized parameter and the parameter compensated by the temperature offset and may perform a read operation on the plurality of memory blocks 750 to 766 of the memory device 150.

Figure 9:
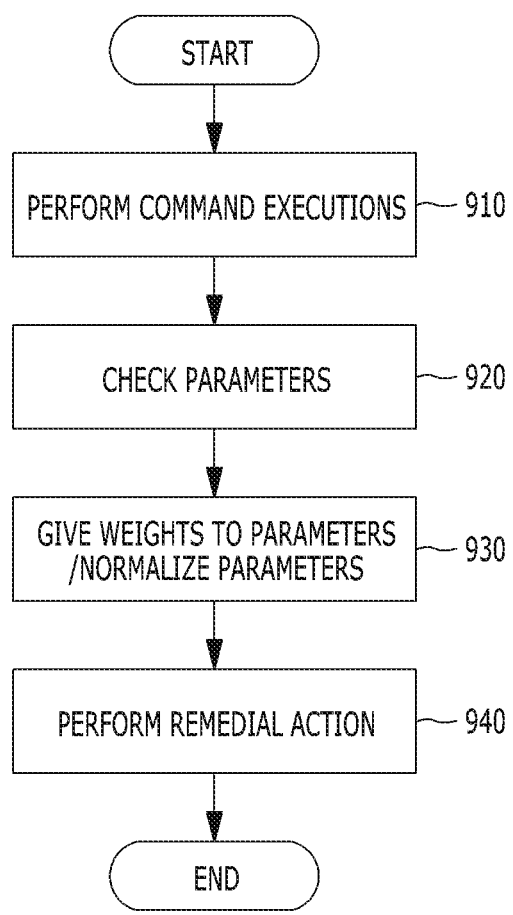
FIG. 9 is a flow chart illustrating a data processing operation in the memory system in accordance with an embodiment of the present invention.

Referring to FIG. 9, at step 910, the memory system 110 may receive a plurality of commands from the host 102 and may perform a plurality of command executions in response to the plurality of commands received from the host 102.

At step 920, the memory system 110 may check parameters of the plurality of memory blocks 750 to 766 of the memory device 150 according to the plurality of command executions performed on the plurality of memory blocks 750 to 766. That is to say, the memory system 110 may check the first parameter, for example the read count 710 corresponding to read operations performed on each of the plurality of memory blocks 750 to 766; the second parameter, for example the program count 725 or the erase count 720 respectively corresponding to program operations or erase operations performed on each of the plurality of memory blocks 750 to 766; and the environmental parameter, for example the temperature offset 730 corresponding to the temperature of the memory system 110 or the memory device 150 according to a plurality of command executions performed on the plurality of memory blocks 750 to 766 of the memory device 150 in response to the plurality of commands received from the host 102.

At step 930, the memory system 110 may give to the first parameter a weight corresponding to the second parameter or may normalize the first parameter through the second parameter. Here, the weighted first parameter 735 or the normalized first parameter 740 may be compensated by the temperature offset 730.

At step 940, the memory system 110 may perform a read reclaim operation and an adaptive read operation or a remedial operation on the plurality of memory blocks 750 to 766 of the memory device 150 according to the parameters of the plurality of memory blocks 750 to 766. Here, a copy operation may be performed as the read reclaim operation according to the first parameter, the weighted first parameter 735 or the normalized first parameter 740 and the first parameter compensated by the temperature offset 730, of the plurality of memory blocks 750 to 766 of the memory device 150. Also, the memory system 110 may compensate for read voltages for the plurality of read operations to be performed on the plurality of memory blocks 750 to 766 of the memory device 150, respectively, by the weighted first parameter 735 or the normalized first parameter 740 and the first parameter compensated by the temperature offset 730, and then may perform the plurality of read operations on the plurality of memory blocks 750 to 766 of the memory device 150.

Since detailed descriptions were made above with reference to FIGS. 5 to 8 for checking the parameters of the plurality of memory blocks 750 to 766 of the memory device 150; giving to the first parameter the weight corresponding to the second parameter or normalizing the first parameter through the second parameter; compensating for the weighted first parameter 735 or the normalized first parameter 740 by the temperature offset 730; and performing a read reclaim operation and an adaptive read operation or a remedial operation on the plurality of memory blocks 750 to 766 of the memory device 150 according to the first parameter, the weighted first parameter 735 or the normalized first parameter 740, the first parameter compensated by the temperature offset 730, and the voltage offsets corresponding to the parameters of the plurality of memory blocks 750 to 766 of the memory device 150, overlapping descriptions thereof will be omitted herein.

FIGS. 10 to 18 are diagrams schematically illustrating application examples of the data processing system of FIG. 1.

Figure 10:
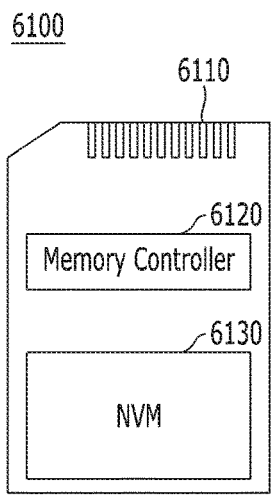
FIGS. 10 to 18 are diagrams illustrating various application examples of data processing systems including the memory system in accordance with the embodiment of the present invention.

FIG. 10 is a diagram schematically illustrating an example of the data processing system including the memory system in accordance with the present embodiment. FIG. 10 schematically illustrates a memory card system to which the memory system in accordance with the present embodiment is applied.

Referring to FIG. 10, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 to 8, and the memory device 6130 may correspond to the memory device 150 of the memory system 110 described with reference to FIGS. 1 to 8.

Thus, the memory controller 6120 may include a RAM, a processing unit, a host interface, a memory interface and an error correction unit. The memory controller 130 may further include the elements shown in FIG. 5, 7, or 8.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIGS. 5, 7, and 8.

The memory controller 6120 and the memory device 6130 may be integrated into a single semiconductor device. For example, the memory controller 6120 and the memory device 6130 may construct a solid state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 11:
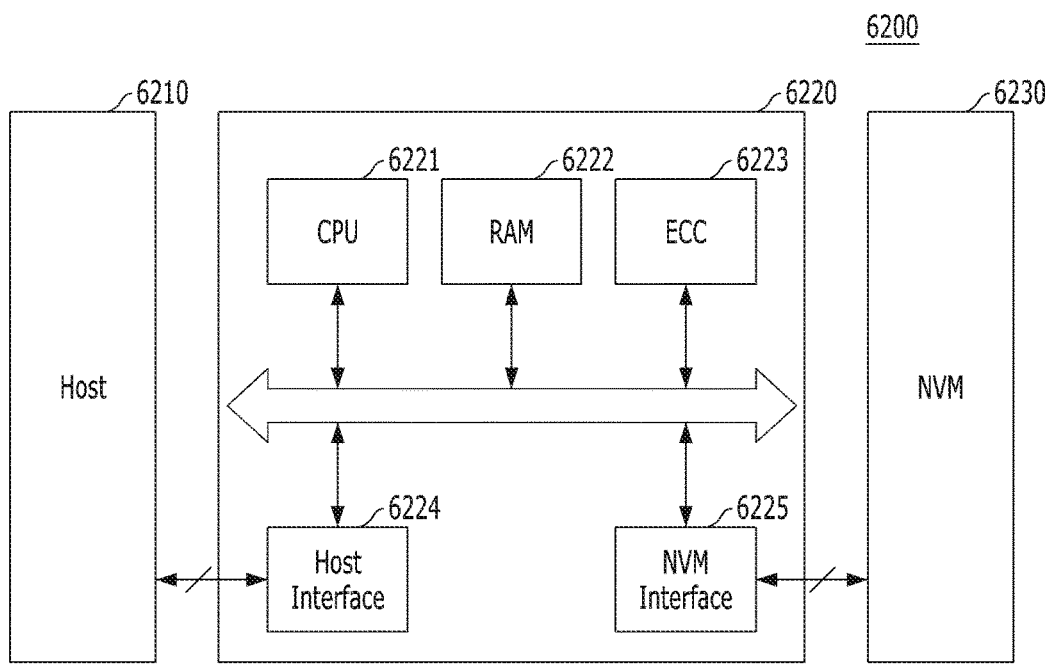

FIG. 11 is a diagram schematically illustrating another example of the data processing system including the memory system in accordance with the present embodiment.

Referring to FIG. 11, the data processing system 6200 may include a memory device 6230 having one or more nonvolatile memories and a memory controller 6220 for controlling the memory device 6230. The data processing system 6200 illustrated in FIG. 11 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 and 5, and the memory controller 6220 may correspond to the controller 130 in the memory system 110 illustrated in FIGS. 1 and 5.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 12:
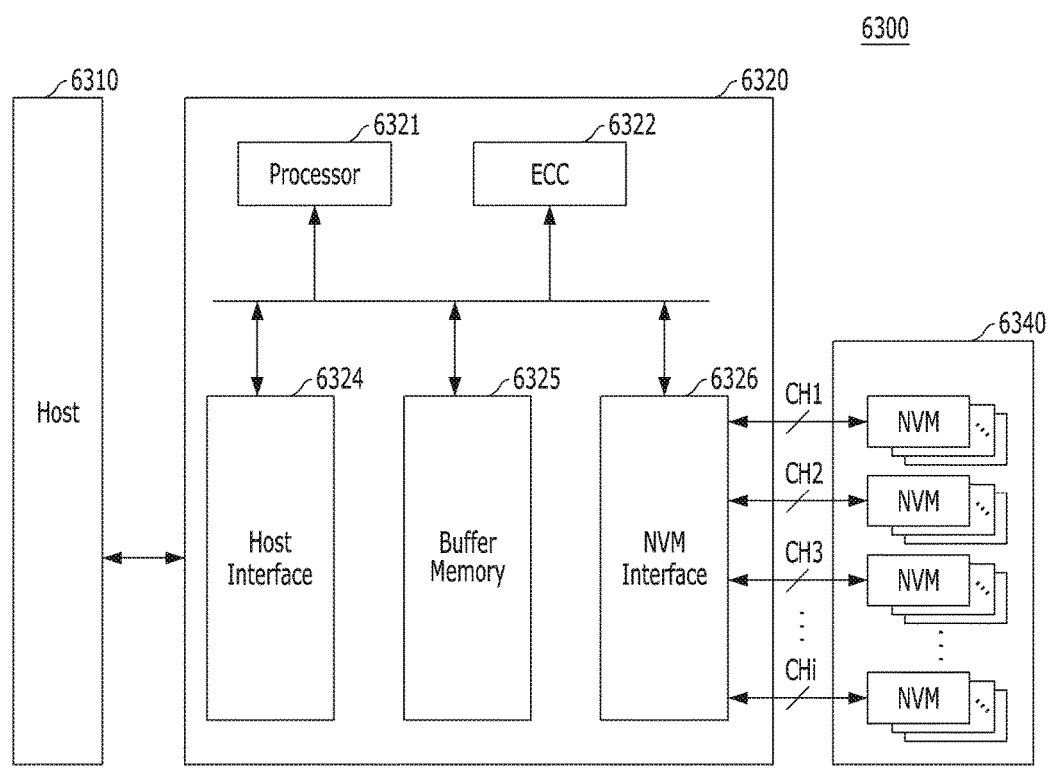

FIG. 12 is a diagram schematically illustrating another example of the data processing system including the memory system in accordance with the present embodiment. FIG. 12 schematically illustrates an SSD to which the memory system in accordance with the present embodiment is applied.

Referring to FIG. 12, the SSD 6300 may include a controller 6320 and a memory device 6340 including a plurality of nonvolatile memories. The controller 6320 may correspond to the controller 130 in the memory system 110 of FIGS. 1 to 8, and the memory device 6340 may correspond to the memory device 150 in the memory system of FIGS. 1 to 8.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STTMRAM and PRAM. For convenience of description, FIG. 11 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 to 8 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 13:
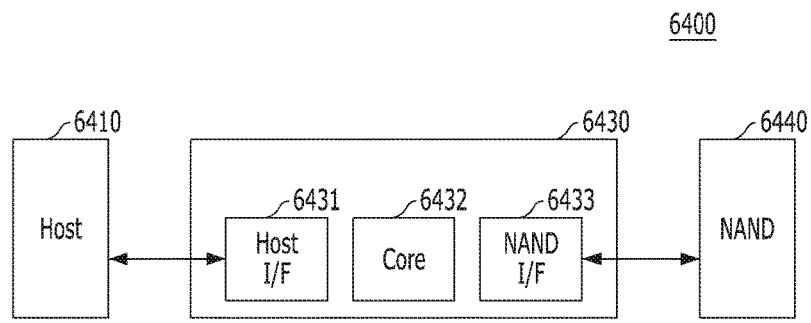

FIG. 13 is a diagram schematically illustrating another example of the data processing system including the memory system in accordance with the present embodiment. FIG. 13 schematically illustrates an embedded Multi-Media Card (eMMC) to which the memory system in accordance with the present embodiment is applied.

Referring to FIG. 13, the eMMC 6400 may include a controller 6430 and a memory device 6440 embodied by one or more NAND flash memories. The controller 6430 may correspond to the controller 130 in the memory system 110 of FIGS. 1 to 8, and the memory device 6440 may correspond to the memory device 150 in the memory system 110 of FIGS. 1 to 8.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 14 to 17 are diagrams schematically illustrating other examples of the data processing system including the memory system in accordance with the present embodiment. FIGS. 14 to 17 schematically illustrate UFS (Universal Flash Storage) systems to which the memory system in accordance with the present embodiment is applied.

Referring to FIGS. 14 to 17, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIGS. 1 to 8. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 11 to 13, and the UFS cards 6530, 6630, 6730 and 6830 may be embodied in the form of the memory card system 6100 described with reference to FIG. 10.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 14:
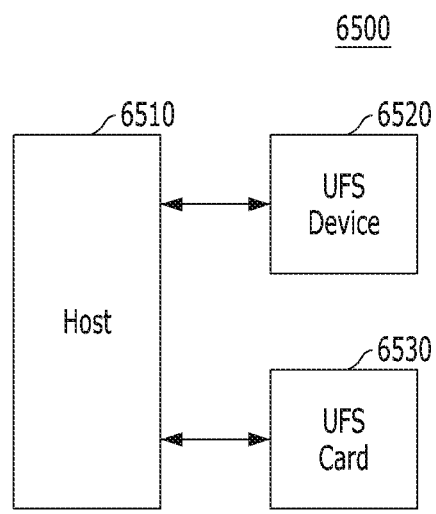

In the UFS system 6500 illustrated in FIG. 14, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In the present embodiment, the configuration in which one UFS device 6520 and one UFS card 6530 are connected to the host 6510 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 15:
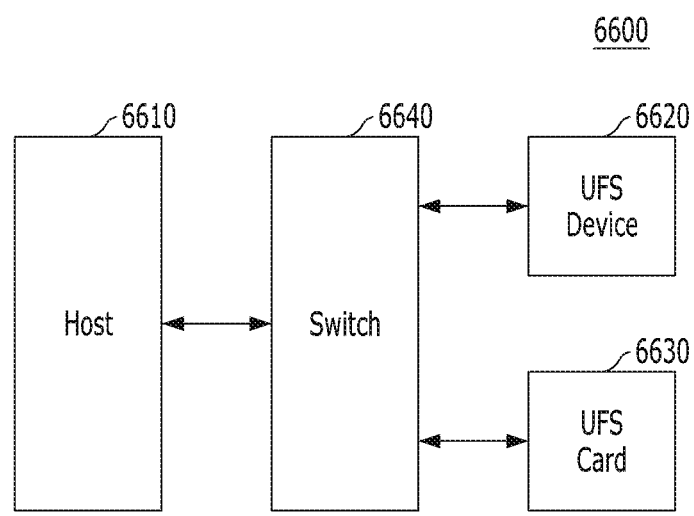

In the UFS system 6600 illustrated in FIG. 15, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 16:
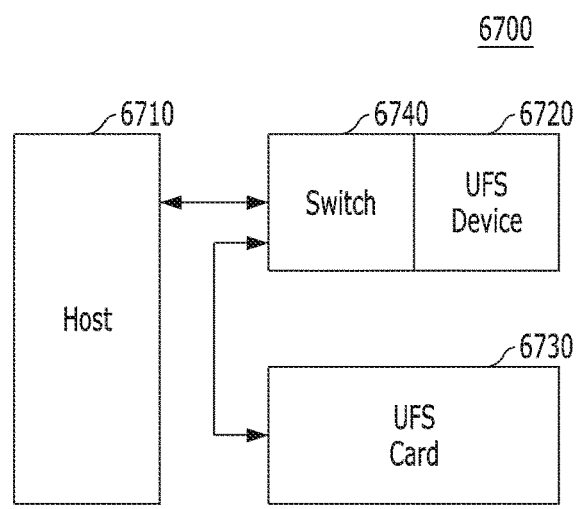

In the UFS system 6700 illustrated in FIG. 16, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 17:
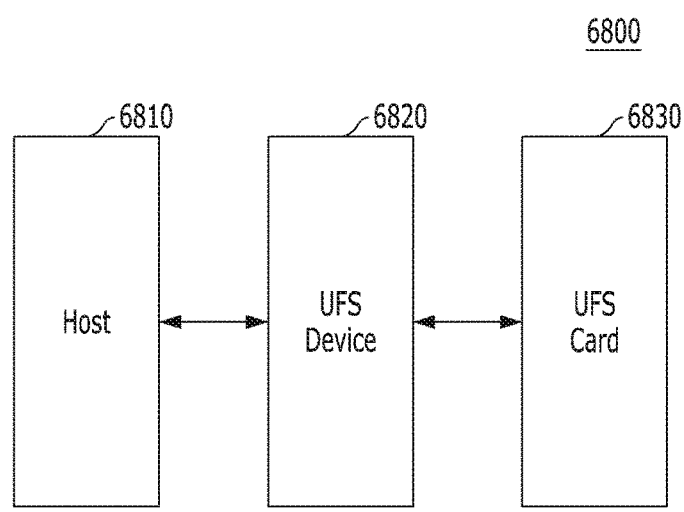

In the UFS system 6800 illustrated in FIG. 17, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 18:
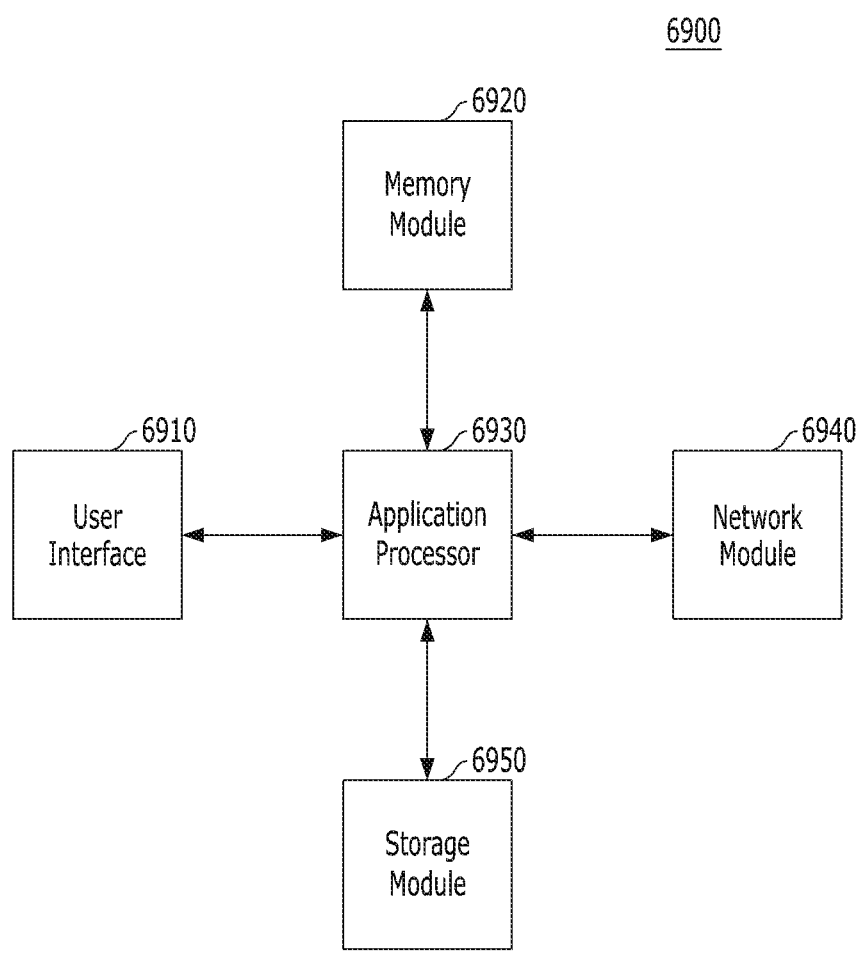

FIG. 18 is a diagram schematically illustrating another example of the data processing system including the memory system in accordance with an embodiment of the present invention. FIG. 18 is a diagram schematically illustrating a user system to which the memory system in accordance with the present embodiment is applied.

Referring to FIG. 18, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 to 8. Furthermore, the storage module 6950 may be embodied as an SSD, eMMC and UFS as described above with reference to FIGS. 12 to 17.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 to 8 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

The memory system and the operating method thereof according to the embodiments may minimize complexity and performance deterioration of the memory system and maximize use efficiency of a memory device, thereby quickly and stably process data with respect to the memory device.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
a memory device including a plurality of memory blocks each including a plurality of pages suitable for storing data; and
a controller suitable for receiving a plurality of commands from a host, performing a plurality of command executions on the plurality of memory blocks in response to the plurality of commands, checking parameters of the plurality of memory blocks according to the plurality of command executions performed on the plurality of memory blocks, selecting first memory blocks among the plurality of memory blocks according to the parameters, and copying data stored in the first memory blocks to second memory blocks among the plurality of memory blocks.

2. The memory system of claim 1, wherein the controller checks parameters of the plurality of memory blocks by checking a first parameter and a second parameter of each of the plurality of memory blocks, and
wherein the controller selects the first memory blocks by calculating a weighted first parameter of each of the plurality of memory blocks by giving to the first parameter a weight corresponding to the second parameter, and selecting the first memory blocks according to the weighted first parameter of each of the plurality of memory blocks.

3. The memory system of claim 2, wherein the controller checks parameters of the plurality of memory blocks by checking a temperature of each of the plurality of memory blocks, and
wherein the controller selects the first memory blocks by calculating a compensated first parameter of each of the plurality of memory blocks by compensating for the weighted first parameter by a temperature offset to the temperature, and selecting the first memory blocks according to the compensated first parameter of each of the plurality of memory blocks.

4. The memory system of claim 3, wherein the controller further calculates a voltage offset of each of the plurality of memory blocks corresponding to the compensated first parameter, compensates for a read voltage for each of a plurality of read operations to be performed on the plurality of memory blocks by the voltage offset, and performs the plurality of read operations on the plurality of memory blocks through the read voltage compensated by the voltage offset.

5. The memory system of claim 2, wherein the controller further calculates a voltage offset of each of the plurality of memory blocks corresponding to the weighted first parameter, compensates for a read voltage for each of a plurality of read operations to be performed on the plurality of memory blocks by the voltage offset, and performs the plurality of read operations on the plurality of memory blocks through the read voltage compensated by the voltage offset.

6. The memory system of claim 1,
wherein the controller checks parameters of the plurality of memory blocks by checking a first parameter and a second parameter of each of the plurality of memory blocks, and
wherein the controller selects the first memory blocks by calculating a normalized first parameter of each of the plurality of memory blocks through the second parameter, and selecting the first memory blocks according to the normalized first parameter of each of the plurality of memory blocks.

7. The memory system of claim 6,
wherein the controller checks parameters of the plurality of memory blocks by checking a temperature of each of the plurality of memory blocks, and
wherein the controller selects the first memory blocks by calculating a compensated first parameter of each of the plurality of memory blocks by compensating for the normalized first parameter by a temperature offset to the temperature, and selecting the first memory blocks according to the compensated first parameter of each of the plurality of memory blocks.

8. The memory system of claim 7, wherein the controller further calculates a voltage offset of each of the plurality of memory blocks corresponding to the compensated first parameter, compensates for a read voltage for each of a plurality of read operations to be performed on the plurality of memory blocks by the voltage offset, and performs the plurality of read operations on the plurality of memory blocks through the read voltage compensated by the voltage offset.

9. The memory system of claim 6, wherein the controller further calculates a voltage offset of each of the plurality of memory blocks corresponding to the normalized first parameter, compensates for a read voltage for each of a plurality of read operations to be performed on the plurality of memory blocks by the voltage offset, and performs the plurality of read operations on the plurality of memory blocks through the read voltage compensated by the voltage offset.

10. The memory system of claim 1,
wherein the controller checks parameters of the plurality of memory blocks by checking a minimum parameter, a maximum parameter, and an average parameter of each of the plurality of pages included in each of the plurality of memory blocks, and selecting one of the minimum parameter, the maximum parameter, and the average parameter as a representative parameter of each of the plurality of memory blocks, and
wherein the controller selects the first memory blocks according to the representative parameter of each of the plurality of memory blocks.

11. An operating method of a memory system, comprising:
receiving a plurality of commands from a host for a memory device including a plurality of memory blocks each including a plurality of pages suitable for storing data;

performing a plurality of command executions on the plurality of memory blocks in response to the plurality of commands;

checking parameters of the plurality of memory blocks according to the plurality of command executions performed on the plurality of memory blocks;

selecting first memory blocks among the plurality of memory blocks according to the parameters; and copying data stored in the first memory blocks to second memory blocks among the plurality of memory blocks.

12. The operating method of claim 11, wherein the checking of the parameters of the plurality of memory blocks is performed by checking a first parameter and a second parameter of each of the plurality of memory blocks, and wherein the selecting of the first memory blocks includes:

calculating a weighted first parameter of each of the plurality of memory blocks by giving to the first parameter a weight corresponding to the second parameter; and selecting the first memory blocks according to the weighted first parameter of each of the plurality of memory blocks.

13. The operating method of claim 12, wherein the checking of the parameters of the plurality of memory blocks is performed by checking a temperature of each of the plurality of memory blocks, and wherein the selecting of the first memory blocks includes:

calculating a compensated first parameter of each of the plurality of memory blocks by compensating for the weighted first parameter by a temperature offset to the temperature; and selecting the first memory blocks according to the compensated first parameter of each of the plurality of memory blocks.

14. The operating method of claim 13, further comprising:

calculating a voltage offset of each of the plurality of memory blocks corresponding to the compensated first parameter;

compensating for a read voltage for each of a plurality of read operations to be performed on the plurality of memory blocks by the voltage offset; and performing the plurality of read operations on the plurality of memory blocks through the read voltage compensated by the voltage offset.

15. The operating method of claim 12, further comprising:

calculating a voltage offset of each of the plurality of memory blocks corresponding to the weighted first parameter;

compensating for a read voltage for each of a plurality of read operations to be performed on the plurality of memory blocks by the voltage offset; and performing the plurality of read operations on the plurality of memory blocks through the read voltage compensated by the voltage offset.

16. The operating method of claim 11, wherein the checking of the parameters of the plurality of memory blocks is performed by checking a first parameter and a second parameter of each of the plurality of memory blocks, and wherein the selecting of the first memory blocks includes:

calculating a normalized first parameter of each of the plurality of memory blocks through the second parameter; and selecting the first memory blocks according to the normalized first parameter of each of the plurality of memory blocks.

17. The operating method of claim 11, wherein the checking of the parameters of the plurality of memory blocks is performed by checking a temperature of each of the plurality of memory blocks, and wherein the selecting of the first memory blocks includes:

calculating a compensated first parameter of each of the plurality of memory blocks by compensating for the normalized first parameter by a temperature offset to the temperature; and selecting the first memory blocks according to the compensated first parameter of each of the plurality of memory blocks.

18. The operating method of claim 17, further comprising:

calculating a voltage offset of each of the plurality of memory blocks corresponding to the compensated first parameter;

compensating for a read voltage for each of a plurality of read operations to be performed on the plurality of memory blocks by the voltage offset; and performing the plurality of read operations on the plurality of memory blocks through the read voltage compensated by the voltage offset.

19. The operating method of claim 16, further comprising:

calculating a voltage offset of each of the plurality of memory blocks corresponding to the normalized first parameter;

compensating for a read voltage for each of a plurality of read operations to be performed on the plurality of memory blocks by the voltage offset; and performing the plurality of read operations on the plurality of memory blocks through the read voltage compensated by the voltage offset.

20. The operating method of claim 11, wherein the checking of the parameters of the plurality of memory blocks includes:

checking a minimum parameter, a maximum parameter and an average parameter of each of the plurality of pages included in each of the plurality of memory blocks; and selecting one of the minimum parameter, the maximum parameter and the average parameter as a representative parameter of each of the plurality of memory blocks, and wherein the selecting of the first memory blocks is performed according to the representative parameter of each of the plurality of memory blocks.

* * * * *